United States Patent
Maimon et al.

(10) Patent No.: US 11,081,606 B2
(45) Date of Patent: Aug. 3, 2021

(54) FLEXIBLE AND ROLLABLE PHOTOVOLTAIC CELL HAVING ENHANCED PROPERTIES OF MECHANICAL IMPACT ABSORPTION

(71) Applicant: SOLARPAINT LTD., Nahsholim (IL)

(72) Inventors: Eran Maimon, Nahsholim (IL); Ramon Joseph Albalak, Haifa (IL); Oded Rozenberg, Nahsholim (IL); Esther Westreich, Neve Yarak (IL)

(73) Assignee: SOLARPAINT LTD., Kibbutz Nahsholim (IL)

( * ) Notice: Subject to any disclaimer, the term of this patent is extended or adjusted under 35 U.S.C. 154(b) by 20 days.

(21) Appl. No.: 16/362,665

(22) Filed: Mar. 24, 2019

(65) Prior Publication Data
US 2020/0212238 A1      Jul. 2, 2020

Related U.S. Application Data

(60) Provisional application No. 62/785,282, filed on Dec. 27, 2018.

(51) Int. Cl.
*H01L 31/0392* (2006.01)
*H01L 27/142* (2014.01)
(Continued)

(52) U.S. Cl.
CPC ...... *H01L 31/03926* (2013.01); *H01L 27/142* (2013.01); *H01L 31/035281* (2013.01);
(Continued)

(58) Field of Classification Search
CPC . H01L 31/18; H01L 31/042; H01L 31/03926; H01L 27/142
See application file for complete search history.

(56) References Cited

U.S. PATENT DOCUMENTS

| 4,038,104 A | 7/1977 | Tsutomu |
| 4,053,327 A | 10/1977 | Meulenberg, Jr. |

(Continued)

OTHER PUBLICATIONS

International Search Report in PCT/IL2019/051416, dated May 5, 2020.

(Continued)

*Primary Examiner* — Ahmed N Sefer
(74) *Attorney, Agent, or Firm* — Eitan Mehulal Sadot

(57) ABSTRACT

Semiconductor substrates and semiconductor devices produced from such substrates, such as photovoltaic (PV) cells, may exhibit toughened physical characteristics making them more suitable for use in mechanically challenging or stressful environments. Semiconductor substrates and semiconductor devices produced from such substrates, such as photovoltaic (PV) cells, may exhibit toughened thermal characteristics making them more suitable for use in environmentally challenging applications. Semiconductor substrates and semiconductor devices produced from such substrates, such as photovoltaic (PV) cells, may exhibit sufficiently toughened characteristics and increase impact resistance to permit packaging in non-rigid and light weight encapsulating layer(s). Semiconductor substrates and semiconductor devices produced from such substrates may exhibit sufficient flexibility to permit for rolling up during shipment and or for non-destructive deformation during deployment over uneven surfaces. Semiconductor devices produced from such substrates may exhibit sufficient flexibility to permit repeated mechanical and/or thermal stresses without failure.

19 Claims, 25 Drawing Sheets

(51) Int. Cl.
  *H01L 31/18* (2006.01)
  *H01L 31/042* (2014.01)
  *H01L 31/054* (2014.01)
  *H01L 31/0352* (2006.01)

(52) U.S. Cl.
  CPC ........ *H01L 31/042* (2013.01); *H01L 31/0543* (2014.12); *H01L 31/18* (2013.01); *Y02E 10/52* (2013.01)

(56) References Cited

U.S. PATENT DOCUMENTS

| | | | | |
|---|---|---|---|---|
| 4,352,948 A * | 10/1982 | Kaplow | ........... | H01L 31/035281 136/246 |
| 9,991,407 B1 * | 6/2018 | Dutta | ................ | H01L 31/03529 |
| 2007/0199588 A1 | 8/2007 | Rubin | | |
| 2009/0056791 A1 * | 3/2009 | Pfenninger | ........... | H01L 31/055 136/247 |
| 2009/0255467 A1 * | 10/2009 | Britt | ................... | H01L 31/0749 118/718 |
| 2010/0031997 A1 * | 2/2010 | Basol | ...................... | H02S 30/20 136/244 |
| 2010/0229923 A1 * | 9/2010 | Frolov | ................ | H01L 31/0392 136/251 |
| 2010/0313955 A1 * | 12/2010 | Buelow, II | ............ | H01L 31/048 136/259 |
| 2011/0100451 A1 | 5/2011 | Krause | | |
| 2011/0155217 A1 * | 6/2011 | Yang | ................ | H01L 31/02168 136/246 |
| 2011/0214721 A1 * | 9/2011 | Mughal | ............... | H01L 31/1804 136/252 |
| 2011/0239450 A1 * | 10/2011 | Basol | .................... | H01L 31/048 29/738 |
| 2011/0277813 A1 * | 11/2011 | Rogers | ........... | H01L 31/035281 136/244 |
| 2012/0240995 A1 * | 9/2012 | Coakley | ............... | H01L 31/0201 136/256 |
| 2012/0312358 A1 * | 12/2012 | Yamashita | .......... | H01L 31/0508 136/251 |
| 2013/0240009 A1 * | 9/2013 | Zhang | ................ | H01L 31/0508 136/244 |
| 2014/0099750 A1 * | 4/2014 | Britt | .................... | H01L 31/1836 438/95 |
| 2014/0283898 A1 | 9/2014 | Pilat | | |
| 2015/0068594 A1 * | 3/2015 | Nishiyama | ........ | H01L 31/02363 136/256 |
| 2015/0280028 A1 * | 10/2015 | Harley | .................. | H01L 31/048 136/249 |
| 2016/0093757 A1 * | 3/2016 | Pass | .................... | H01L 31/0512 136/244 |
| 2016/0247959 A1 | 8/2016 | Wiedeman | | |
| 2016/0284909 A1 * | 9/2016 | Harley | .................. | H01L 31/042 |
| 2016/0308155 A1 | 10/2016 | Maimon | | |
| 2016/0351343 A1 * | 12/2016 | Lindstrom | ........... | H01G 9/2022 |
| 2017/0236953 A1 * | 8/2017 | Dutta | ................. | H01L 31/0236 136/256 |
| 2017/0330993 A1 * | 11/2017 | Sewell | ........... | H01L 31/022441 |
| 2018/0151303 A1 | 5/2018 | Maimon | | |
| 2018/0286993 A1 | 10/2018 | Maimon | | |

OTHER PUBLICATIONS

Written Opinion of the International Searching Authority in PCT/IL2019/051416, dated May 5, 2020.

\* cited by examiner

Substrate Before Scribing/Dicing in two directions

Substrate Before Scribing/Dicing in one direction

Substrate Before Scribing/Dicing

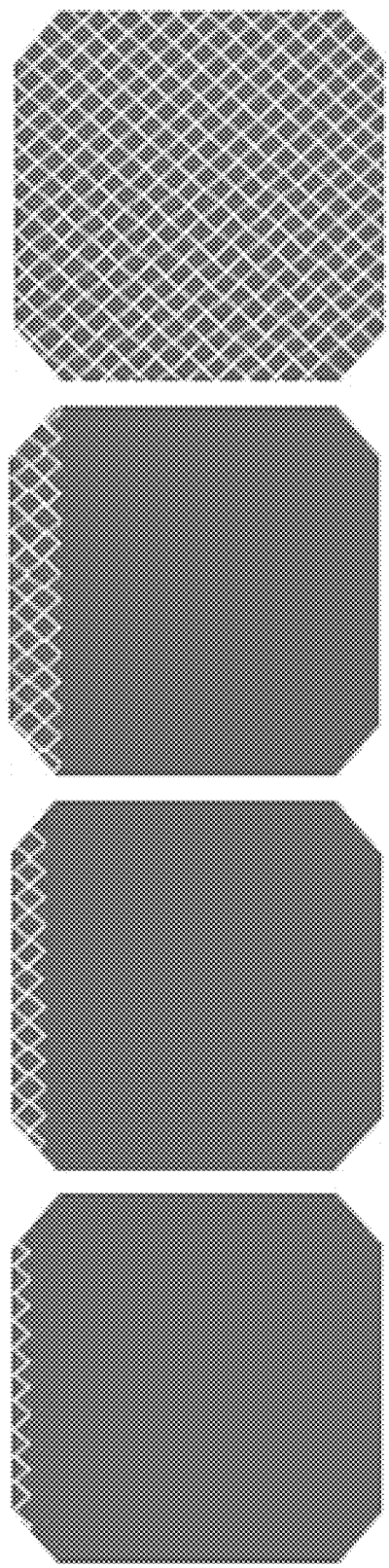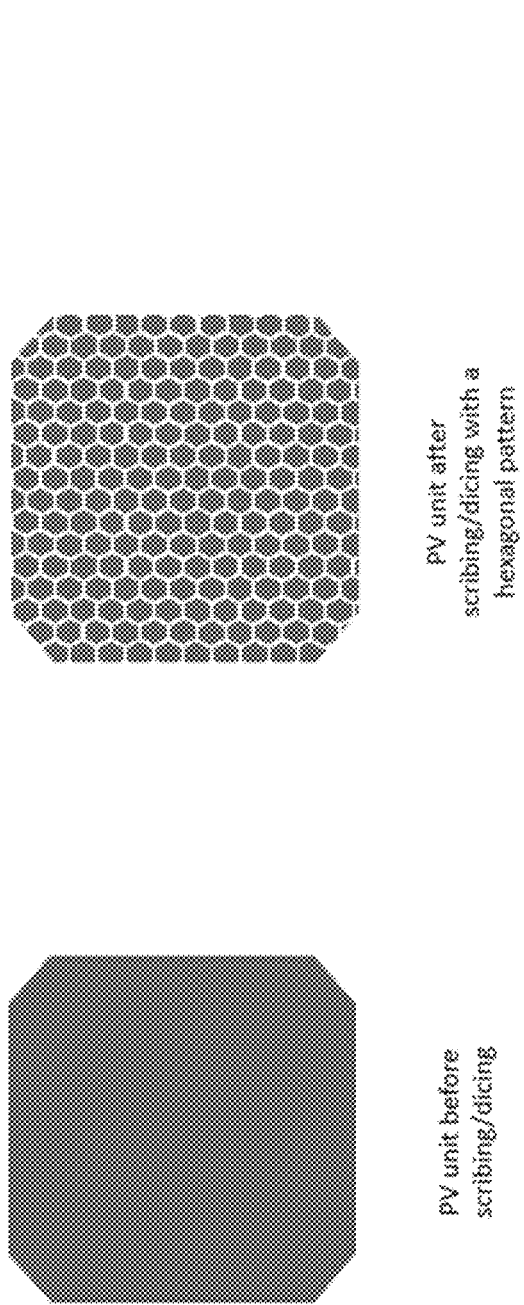
Fig. 5B
Fig. 5C

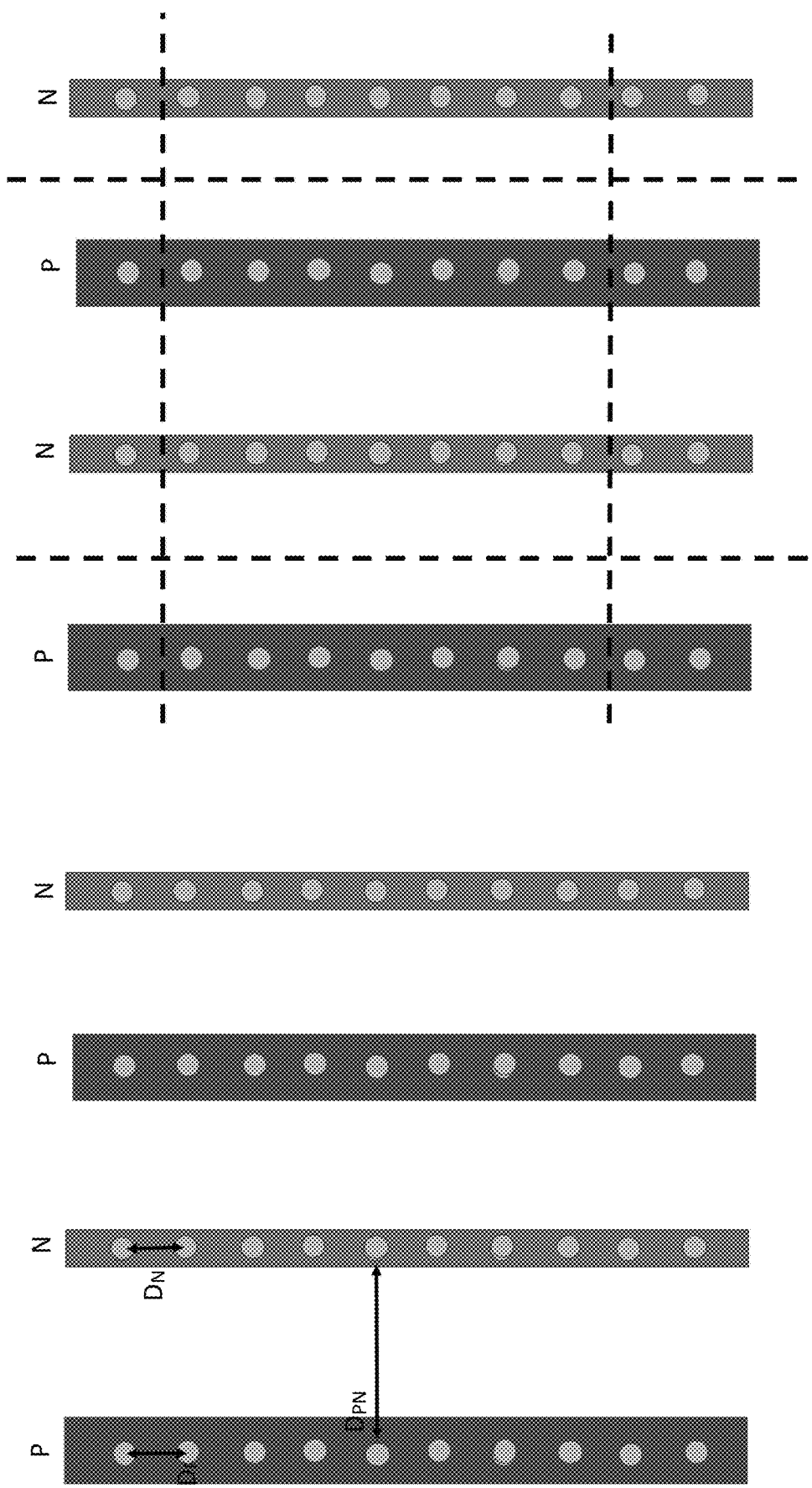

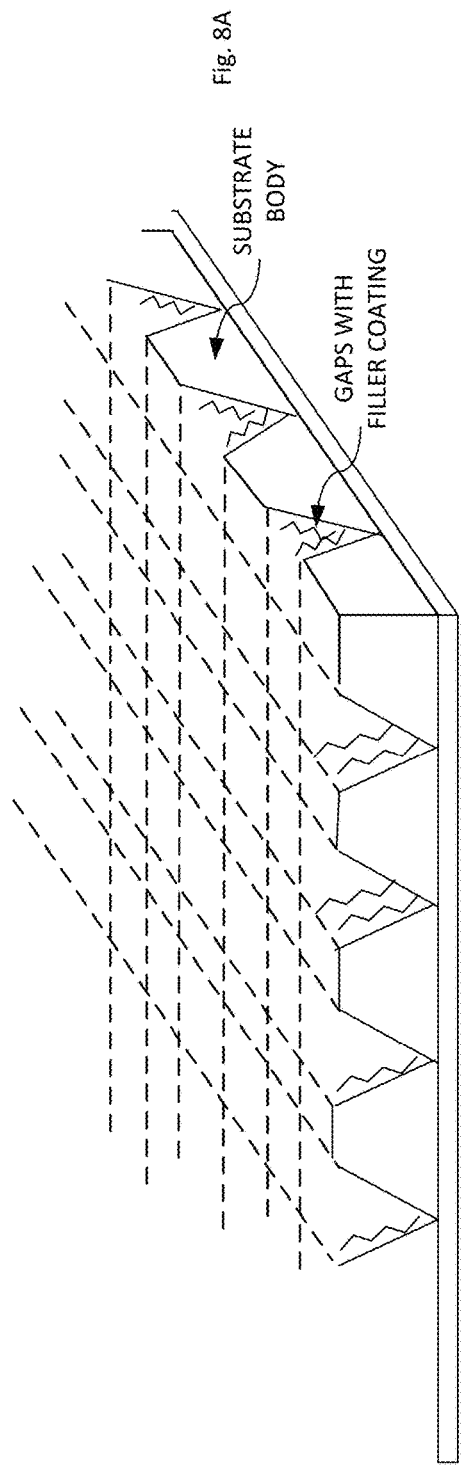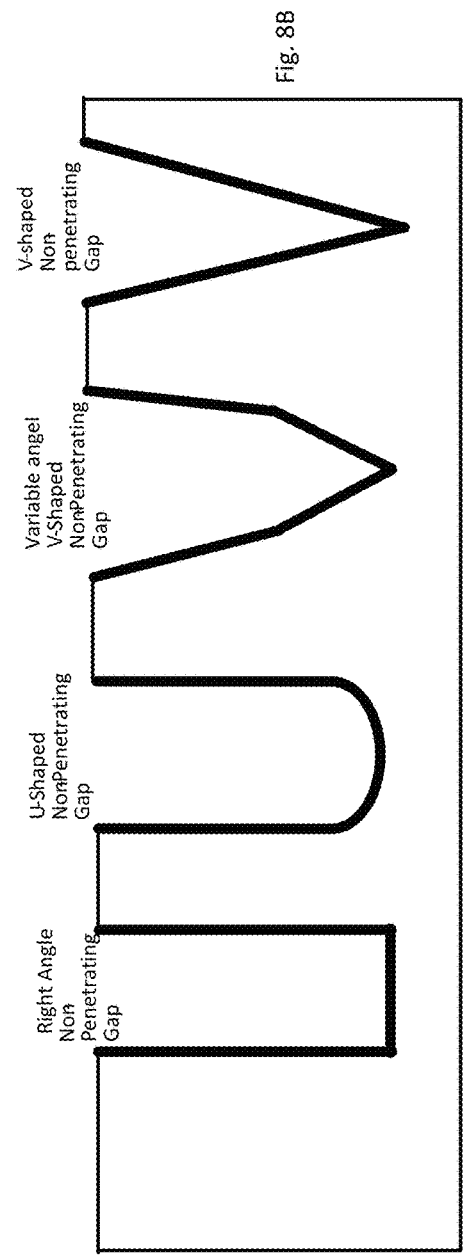

2. Wafer after partial singulation
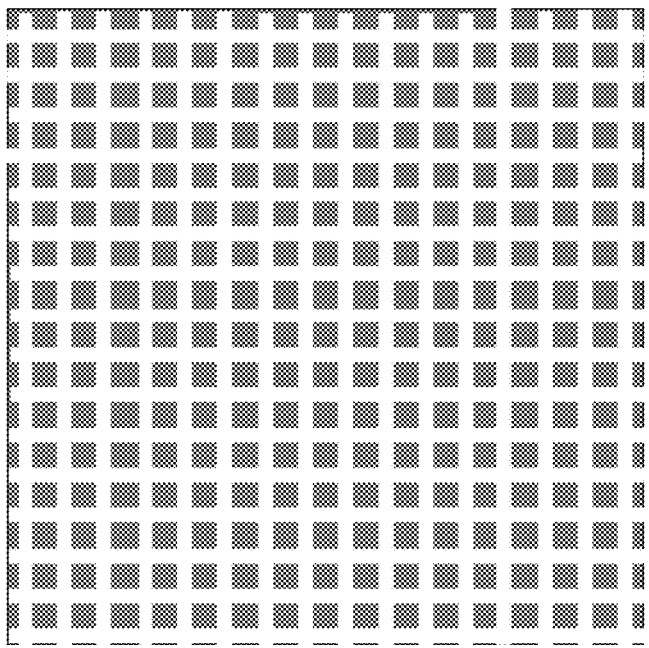
(top view)
(side view)
1. Wafer before processing
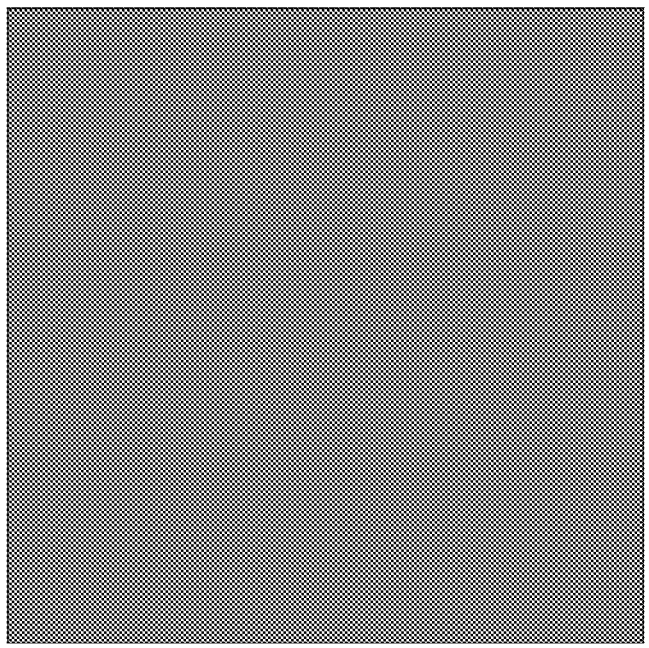
(top view)
(side view)
Fig. 9A 3. Partially singulated wafer after incorporating toughening agent into kerfs. Coating on top layer is optional.
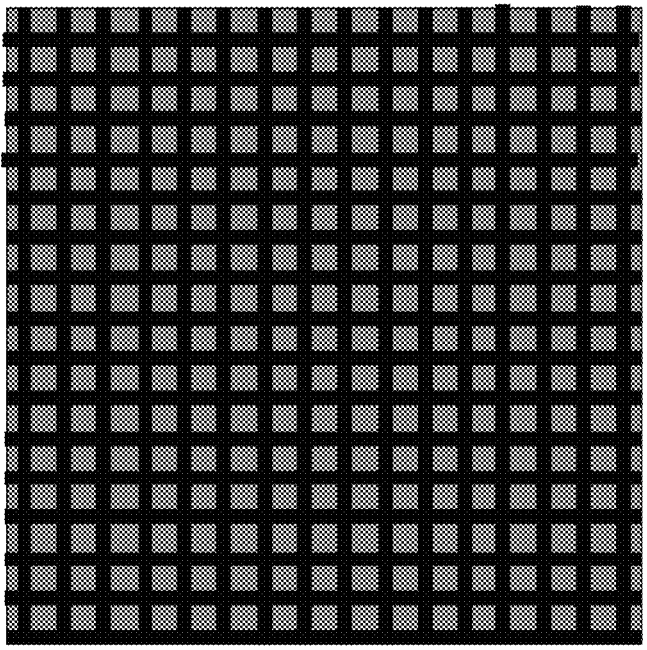
(A-A section)
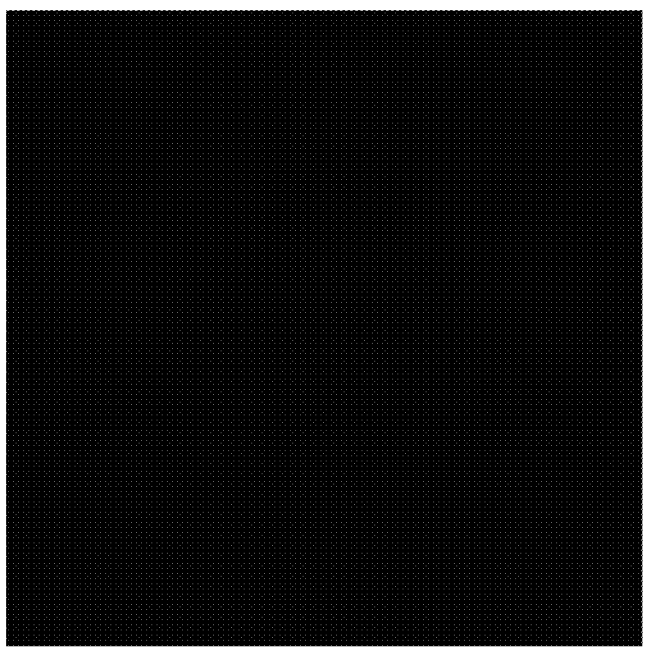
(top view)
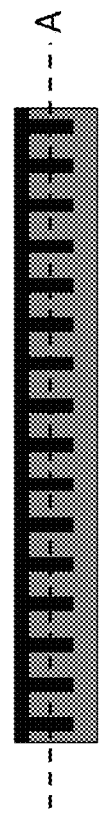
(side view)
Fig. 9B 2. Wafer after top and bottom partial singulation
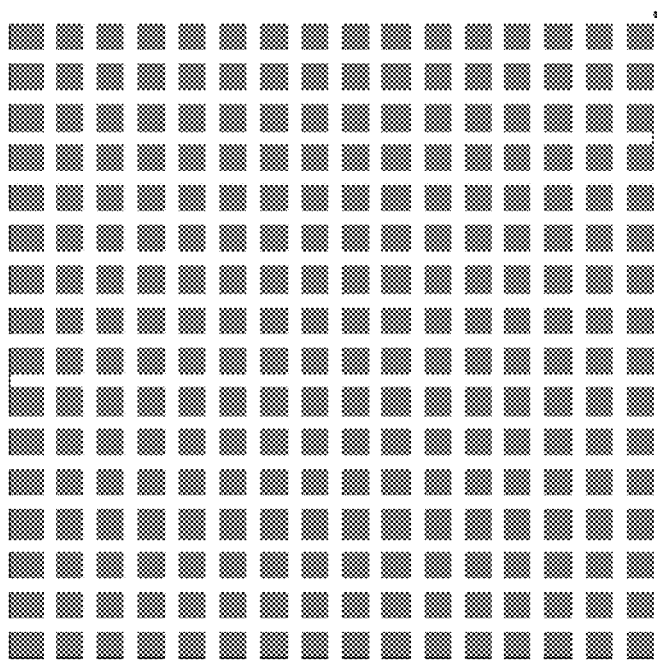
(top view)
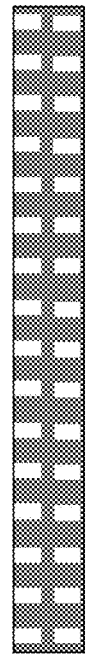
(side view)
1. Wafer before processing
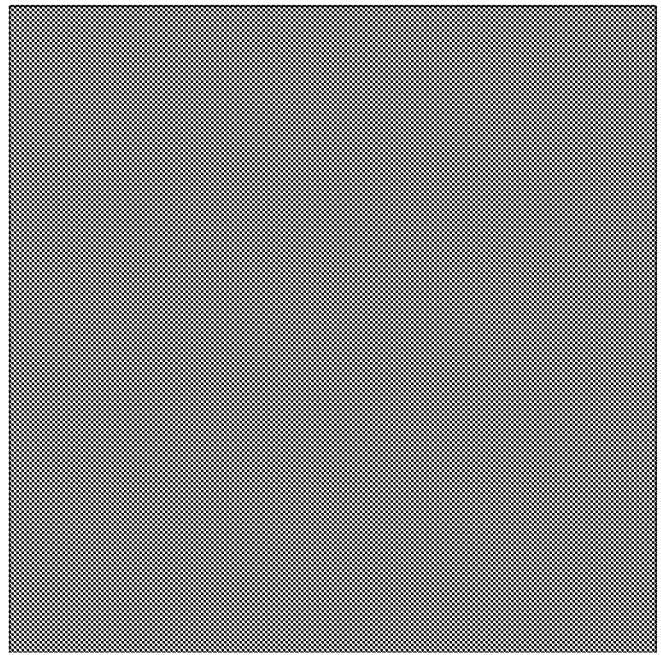
(top view)
(side view)
Fig. 9C 3. Partially singulated wafer after incorporating toughening agent into top and bottom kerfs. Coating on top layer is optional.
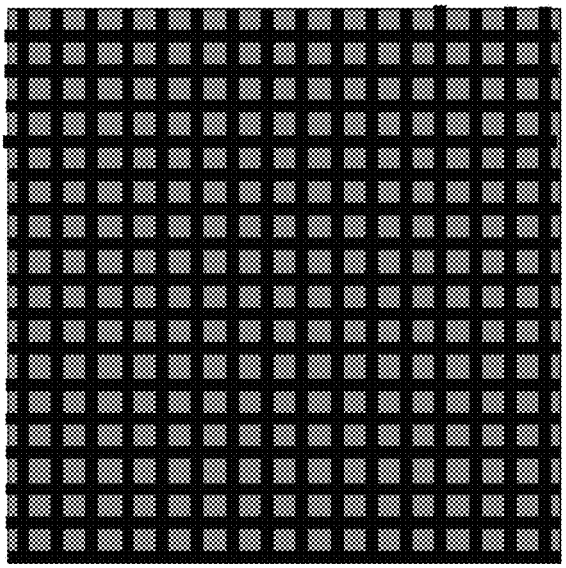
(A-A section)
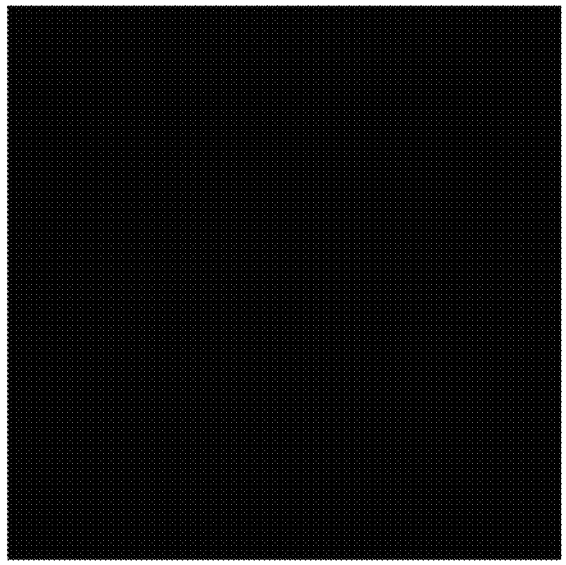
(top view)
(side view)
Fig. 9D

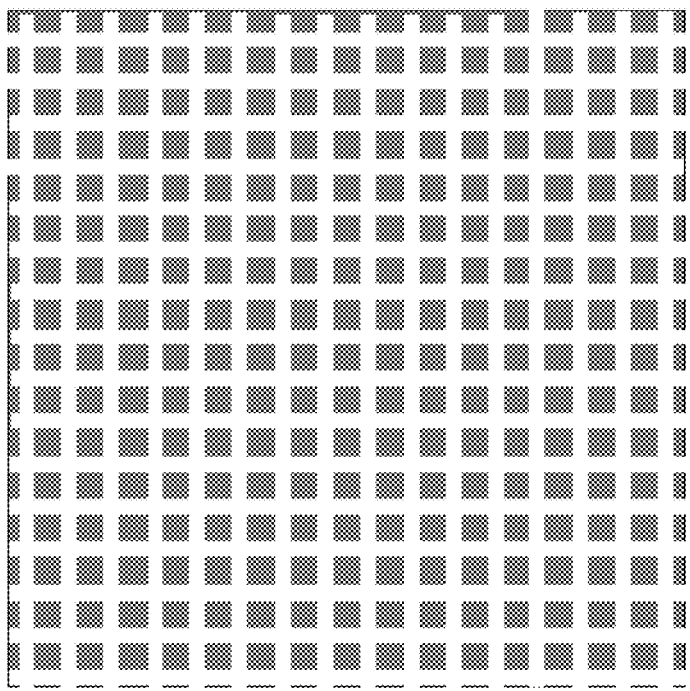
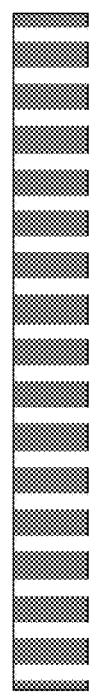
2. Wafer after full singulation (top view) (side view)
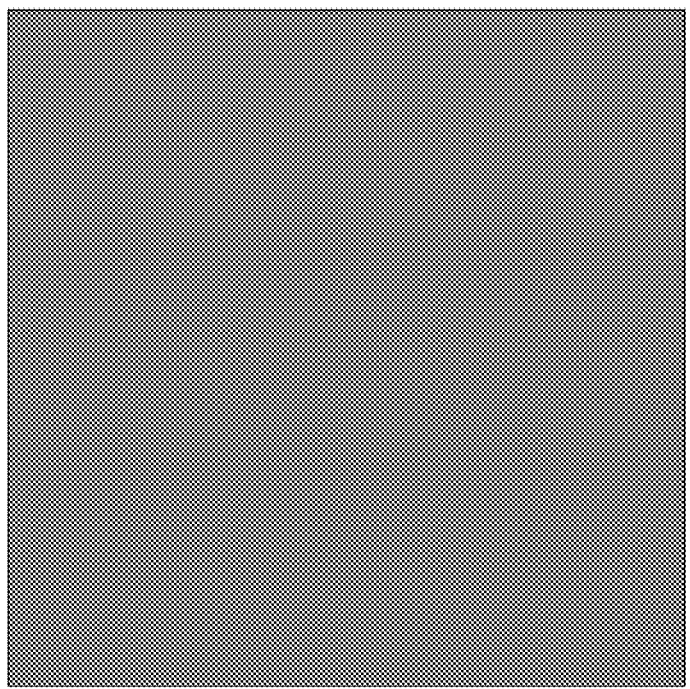
1. Wafer before processing (top view) (side view)
Fig. 9E 3. Fully singulated wafer after incorporating toughening agent into kerfs. Coating on top layer is optional.
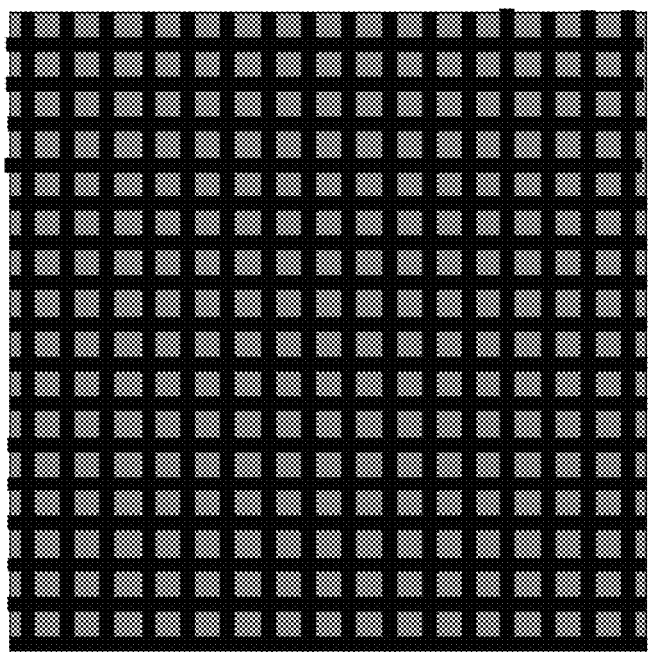
(A-A section)
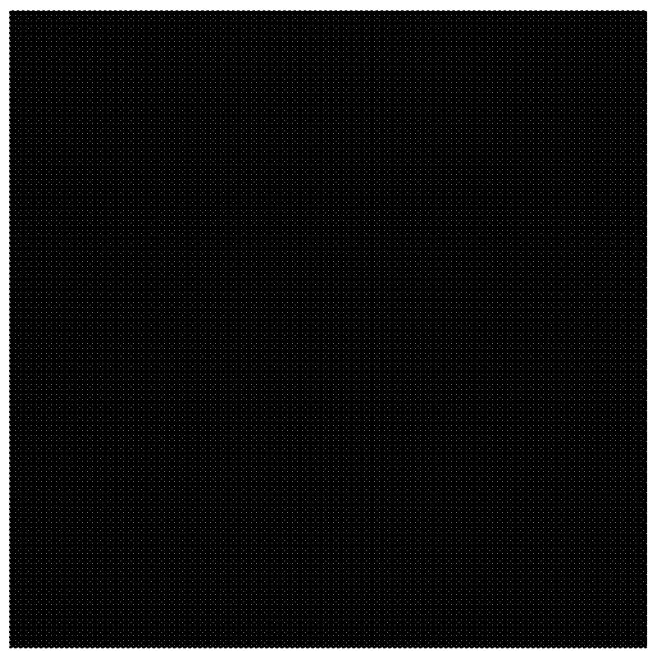
(top view)
(side view)
Fig. 9F

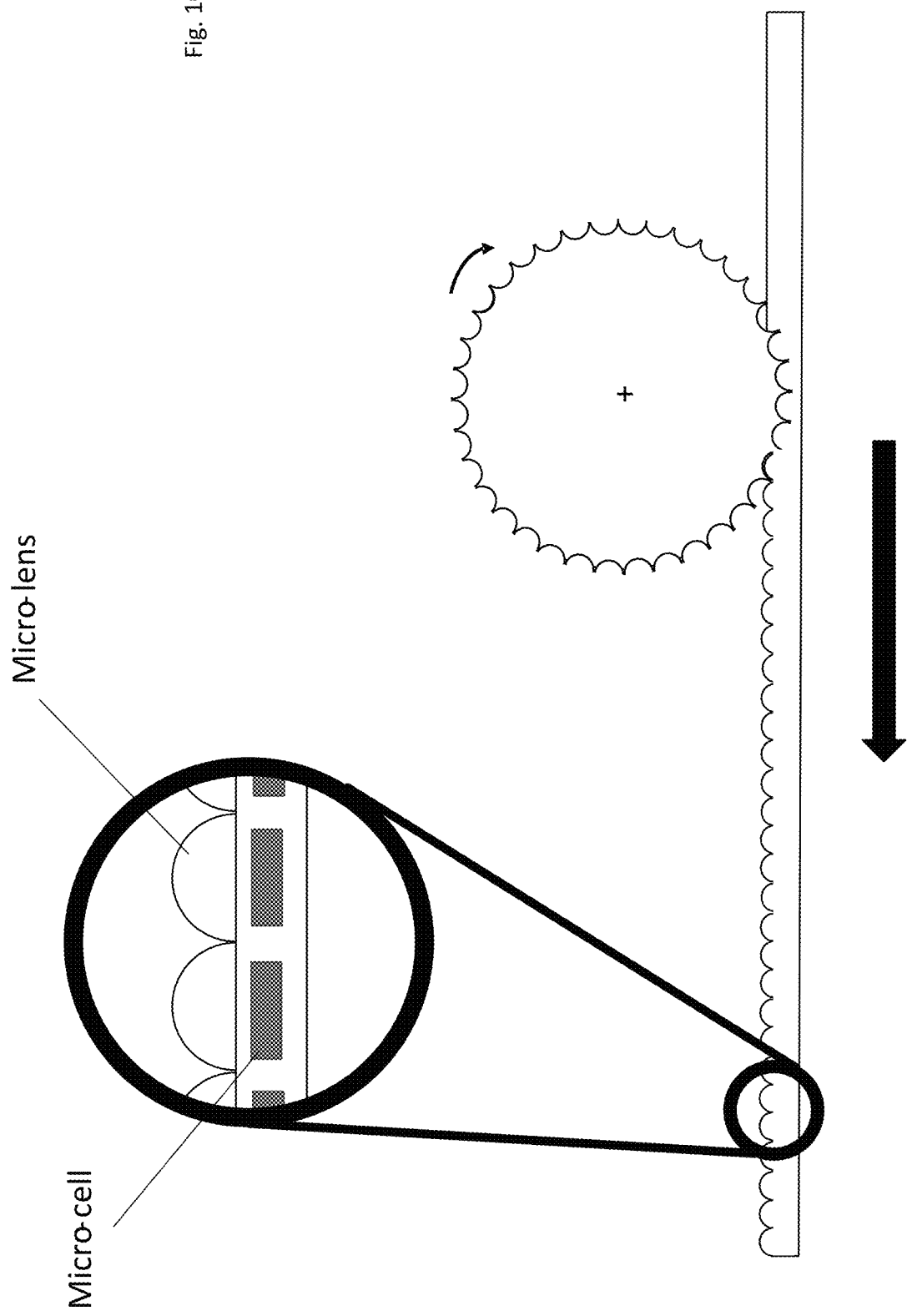

FLEXIBLE AND ROLLABLE PHOTOVOLTAIC CELL HAVING ENHANCED PROPERTIES OF MECHANICAL IMPACT ABSORPTION

RELATED APPLICATIONS

The present patent applications claims priority from U.S. Provisional Patent Application Ser. No.: 62/785,282, filed on 27 Dec. 2018 and entitled: "A flexible pholtovoltaic panel, process for the production thereof and select application", the disclosure of which is hereby incorporated by reference in its entirety.

FIELD OF THE INVENTION

The present invention generally relates to the field of semiconductors, more specifically to photovoltaic (PV) cells, PV modules, arrays and methods of producing same.

BACKGROUND

Semiconductor devices are constructed on semiconductor substrates by processing the substrate body's material in various ways, including etching, impurity doping, reactive coating and surface deposition. Various devices such as transistors, integrated circuits, processors and Photovoltaic cells may be produced on a semiconductor substrate, which substrate may comprise all or a portion of the semiconductor wafer from which the substrate originated.

Semiconductor wafers and substrates, the terms herein after to be used interchangeably, are generally made from brittle crystal-type materials such a Silicon, Gallium Arsenide, etc. Accordingly, devices made from these materials are generally susceptible to breaking when under stress or upon experiencing a physical impact. These shortcomings necessitate substantial packaging and protection and susceptible to breakage during handling fabrication and transport. This is even more pronounced in full wafer scale applications such as PV where the semiconductor substrate is usually 5"-6" wide. Accordingly, there is a need in the semiconductor field for toughened and or flexible semiconductor wafers, with enhanced physical toughness characteristics and for methods of producing same. There is a need in the PV production field for toughened and or flexible semiconductor PV substrates and devices with enhanced physical toughness characteristics and for methods of producing same.

A solar cell, or photovoltaic (PV) cell, is an electrical device that converts the energy of light or photons directly into electricity by the photovoltaic effect, a physical and chemical phenomenon. The most commonly used solar cells are configured as a large-area p-n junction made from silicon. Other possible solar cell types are thin film like CdTe or CIGS, organic solar cells, dye sensitized solar cells, perovskite solar cells, quantum dot solar cells etc. Solar cell operate according to the following principles: (1) Photons in sunlight hit the solar panel and are absorbed by semiconducting materials, such as silicon; (2) Electrons are excited by the photons from their current molecular/atomic orbital in the semiconducting material; (3) Once excited an electron can either dissipate the energy as heat and return to its orbital or travel through the cell until it reaches an electrode; (4) Current flows through the material to cancel the potential and this electricity is captured. The chemical bonds of the cell material are vital for this process to work, and usually silicon is used in two regions, one region being doped with boron, the other phosphorus. These regions have different chemical electric charges and subsequently both drive and direct the current of electrons towards a relevant electrode.

An array of solar cells converts solar energy into a usable amount of direct current (DC) electricity. Individual solar cell devices can be combined to form modules, otherwise known as solar panels. In some cases an inverter can convert DC current/power from a panel into alternating current (AC).

Demand for renewable energy and in particular solar energy is constantly rising due to a global initiative to provide alternatives for fossil fuels. The use of solar energy is becoming one of the most promising alternatives for a renewable energy source, with supply growing about 30% per year. The future of solar is promising to provide an abundance of available electrical energy at cost competitive with those for fossil fuels.

As current silicon solar modules, panels, are heavy and rigid, their use is limited in applications where weight, shape or accessibility are constraints. Additionally, today's PV modules are also expensive to transport and install. Flexible solar panels of arbitrary length on a roll would solve many of these issues. However, the current state of the art solutions for providing flexible PV panels are still under development and industrial scale production of such sheets is extremely expensive. Additionally, today's flexible panel solutions are not durable. Regardless of cost, most of the flexible PV panels available today are not sufficiently flexible for rolling.

There is therefore a need in the art for low cost and improved flexible solar electricity producing surfaces. There is also a need in the art for flexible PV modules with improved durability.

SUMMARY OF INVENTION

The present invention includes methods, devices and materials for producing toughened semiconductor substrates. Semiconductor substrates and semiconductor devices produced from such substrates may exhibit toughened physical characteristics making, them more suitable for use in mechanically challenging or stressful applications and environment. Semiconductor substrates and semiconductor devices produced from such substrates may exhibit toughened thermal characteristics, making them more suitable for use in environmentally challenging applications. Semiconductor substrates and semiconductor devices produced from such substrates may exhibit sufficiently toughened characteristics to permit packaging in non-rigid and light weight encapsulant(s). Semiconductor substrates and semiconductor devices produced from such substrates may exhibit sufficient flexibility on a scale suitable to permit for rolling up during shipment and or for non-destructive deformation during deployment over uneven surfaces.

Embodiments of the present invention may include a toughened semiconductor substrate comprising a substrate body composed of semiconductor material and having top, bottom and side surfaces. The semiconductor body may have at least one intentionally placed gap therein, wherein the intentionally placed gap may be placed by separating segments of the body, either from the top, the bottom or both (e.g. cracking, breaking, etc.), or by removing material from the body, either from the top, the bottom or both (e.g. sawing, etching, cutting, laser cutting, dicing, milling, etc.). An intentionally placed gap according to embodiments of the invention may be is at least 0.01 mm deep. An intentionally placed gap according to embodiments of the invention may have a varying depth and/or a varying width. Said gap may act as a crack, micro-crack, and or nano-crack propagation inhibitor.

According to embodiments, at least some semiconductor body gaps may include a gap filler within said at least one intentionally placed gap. The gap filler may be at least partially composed of a material possessing mechanical force or shock absorption, compressibility and or stretchability and or flexibility and/or toughening properties. Accordingly, some gap filler material may also be referred to as toughening agents. The gap filler may be at least partially composed of a material possessing thermal absorption and/or thermal dissipation properties. The gap filler may be at least partially composed of a material possessing electrically insulative properties. According to some embodiments, a gap filler may be reactively grown within a respective gap, while according to other embodiments, a gap filler may be deposited within a respective gap. A gap filler may form a coating over sidewalls of a respective gap. A gap filler may form a coating over shoulders of sidewalls of a respective gap and may form a continuous layer at the level of said shoulders.

Gap filler according to some embodiment may be composed of at least one material selected from the group consisting of: (a) a polymer; (b) a resin, (c) amorphous silicon; (d) glass; (e) a metal; (f) carbon; (g) oxygen; (h) a monomer; (i) a second semiconductor; (j) an oligomer; (k) a reactive system (e.g. monomer and photo-initiator); (l) EVA; (m) PVDF; (n) Silicone; and (o) a combination of 2 or more of the above. Gap filler may be homogeneous, or may be a heterogeneous system comprised of at least one matrix material (e.g. a poymer) and at least one additive (e.g. discrete domains of a second, softer polymer)

According to embodiments of the present invention, a gap filler may be reactively produced inside of a respective gap. According to a first example, a reactive chemical such as oxygen or ammonia may be introduced during laser cutting or chemical etching of the gap, and a reaction between the reactive chemical and material of the gap sidewalls may form a coating on the sidewalls. The coating may be of varying thickness, and in some cases may expand to push the sidewalls apart. +According to other examples, a reactive mixture of chemicals may be introduced into an already placed/produced gap, and the reactive mixture may be allowed to react within the gap, thereby filling the gap with a product of the reaction, which in some cases may physically push the gap sidewalls apart.

According to further embodiments, a gap filler may include a set of materials deposited as discrete layers within or across said gap. Different layers of the deposited discrete layers may have different properties and serve different toughening functions in accordance with the present invention.

Gap filler material may include Polymer/oligomer/monomer systems for mechanical toughening—EVA, HIPS (high-impact polystyrene), thermoplastic elastomers (TPEs), block copolymers of polystyrene-polybutadiene and/or polystyrene-polyisoprene (diblock, triblock, multiblock and random copolymers), polybutadiene neoprene, EPDM and other rubbers/elastomers and flexible materials Gap filler material for heat and electrical conductivity may include or contain carbon fibers, metallic powders, nano-particles, nano-fibers, filings and/or fibers, including but not limited to iron, copper, silver, aluminum and/or mixtures and/or alloys of the above distributed in a polymeric, ceramic or other matrix as well as conductive polymers, CNTs, Graphene.

Gap filler which provide reactive mixtures that swell upon reaction include such mixtures as a poly-isocyanate and a polyol with or without the presence of water to produce a foamed polyurethane. Alternative blowing agents such as azodicarbonamide may also be incorporated in order to create foam resulting in expansion of the material within the gaps and an increase in volume that will increase the width of the gaps.

According to embodiments, at least part of the gap filler material may be an anisotropic material. According to an exemplary embodiment, anisotropic particles of fibers may be affixed in a specific direction relative to the top or bottom surface of the body matrix as well as conductive polymers, CNTs, Graphene., suspended within a binding material such as a polymer. Anisotropic particles, such as micro-fibers may be aligned, in one direction or another relative to a top or bottom surface or a different specific plane in the substrate, prior to curing of the filler material by using a magnetic or an electric field. Such a mixture may serve to toughen the substrate physically and thermally. Particles, isotropic or anisotropic in nature, may be present either below or above the percolation threshold.

Gap filler material which is anisotropic can lend anisotropic characteristics to the semiconductor substrate/wafer. The filler material may contain anisotropic particles (e.g. microfibers) that me be aligned or oriented using an external force field, such as a magnetic or electrical field. If these anisotropic particles are embedded in a filler matrix which can be "set" (such as a polymer, monomer or oligomer that can be crosslinked), these properties will remain with a permanent preferred orientation even after turning off the external aligning force field.

According to embodiments, the semiconductor body may be composed of at least one semiconductor material selected from the group consisting of: silicon, silicon dioxide, aluminum oxide, sapphire, germanium, gallium arsenide (GaAs), CdTe, organic/inorganic perovskite based materials, CIGS (CuGaInS/Se) and indium phosphide (InP). The semiconductor body may be configured to provide a semiconductor device selected from the group consisting of: a Photo Voltaic Cell, a Light Emitting Diode, a Transistor, a Power Transistor, an Integrated Circuit, a Very Large Scale Integration, and a Microelectromechanical systems (MEMS).

According to embodiments of the present invention, the intentionally placed gap may be produced by removing material from the substrate body, either physically, chemically, with a laser or otherwise. The intentionally placed gap may extend across at least the top surface of the substrate body in a single line or in a pattern composed of an array of lines or other shapes. The intentionally placed gap may actually extend across each of the top surface and the bottom surface of the substrate body, thereby forming separate and different gap patterns both on the top surface and on the bottom surface of the substrate. The singulating pattern or map on the top of the wafer may or may not coincide with the singulating pattern/map on the bottom of the wafer. Gap filler may be introduced into some or all of the gaps, on either side. In the case of singulating from both sides a continuous layer of the semiconductor substrate or wafer, some material may remain through a middle layer of the wafer (not necessarily at the location of half the thickness). According to further embodiments, gap patterns on different sides of the substrate may be filled with different gap filler material. While according to even further embodiments, some or all of a gap pattern on either or both surfaces may be left empty.

The material used to fill the gaps on the bottom of the wafer may be the same material used to fill the gaps on the top of the substrate/wafer, or may be a different material. The material introduced into a gap may partially fill the gap vertically (i.e. fill the bottom of the gap), may fill the gap completely (i.e. flush with the top surface adjacent to the gap), or may overflow and partially or fully cover the top surface adjacent to the gap.

According to embodiments of the present invention, the intentionally placed gap may be produced by removing material from said substrate body all the way completely through the semiconductor body from top surface to bottom surface. The intentionally placed gap, completely passing from top to bottom surface, may extend across the top or bottom surface of said substrate body in a single line or in a pattern composed of an array of lines or other shapes. According to such embodiment, the semiconductor substrate may be completely singulated or split into pieces. According to such fully singulated embodiments, the gap filler material and/or an external films placed over the top surface, over the bottom surface or over both surfaces may serve to maintain the substrate's physical integrity. According to further embodiments, one or more electrical conductors connecting terminals on the singulated substrate pieces to one another may serve to maintain an electrical functionality of the semiconductor substrate.

Embodiments of the present invention may include photovoltaic (PV) cells, arrays of PV cells and methods of producing same. Further embodiments of the present invention may include PV cells and arrays of PV cells with enhanced toughness and or durability and or flexibility, and methods of producing same. According to embodiments of the present invention, a PV cell with enhanced toughness and or durability and or flexibility may be produced by separating, partially or completely, segments of material within a semiconductor substrate or wafer with which the PV cell is produced, before or after producing the PV cell from the semiconductor substrate and introducing a toughening agent or material, such as a flexible polymer, resin or other flexible impurity, between the separated wafer or substrate (terms wafer and substrate used interchangeably throughout this application) segments. The toughening material may be a composite material, deposited as a single layer or in multiple layers within the gaps. According to multi-layer gap filler embodiments, different layers may exhibit different properties and may performed different functions within the enhanced wafer. Some gap filler materials may provide enhanced heat conduction functionality, for example by including and or introducing heat conduction additives into the wafer gaps. Any of the gap filler material previously mentioned is applicable to the PV cell embodiment. Any substrate body material previously mentioned is applicable to the PV cell embodiment.

According to some embodiments, material of a wafer or substrate (terms used interchangeably through this application) may be separate by means of fracturing, where little to no material is removed or otherwise lost from the wafer. According to other embodiments, segments of a PV cell wafer may be separated by cutting, scribing, etching, dicing and or any other method known today or to be devised tomorrow, where some of the wafer material is removed. Removal of wafer material may be complete, from a top surface through to a bottom surface of the wafer, or it may be partial, leaving some wafer material behind at the top or bottom of the wafer. Separation of wafer segments, complete or partial, with or without material removal, may be performed from one end of the wafer to the other end and may also be performed multiple times in order to form a pattern of separations. According to further embodiments, a separation pattern may be selected to correspond to a specific orientation with respect to a crystal lattice of the wafer being separated.

According to embodiments of the present invention, irrespective of whether substrate or wafer segment gaps in between wafer segments of a PV cell wafer are complete or partial, with or without material removal, a flexible material may be deposited in the gaps. Deposition may optionally include melting, physical spreading, vapor deposition, solvent assisted deposition, CBD, printing, or by any other method known today or to be devised in the future for depositing material onto a semiconductor wafer. Deposition of the material in the gap may be conducted simultaneously with another process in which the filler material also plays a role, e.g. a filler material may also act as an adhesive to a top sheet or layer laminated to the semiconductor wafer. One example of this is the use of EVA as filler material which simultaneously acts as an adhesive layer to a topsheet of ETFE. In this example, EVA may be incorporated in film form which at given temperature and pressure liquifies, penetrates the gaps and simultaneously forms an encapsulating film covering the semiconductor wafer and also functioning as an adhesive to the top sheet above. The gap filing material may be composed of a flexible (compressible and stretchable) polymer as previously elaborated. The gap filing material may exhibit good mechanical shock absorption and or dissipation characteristics. According to some embodiments, the gap filling material may be deposited as part of a top or bottom lamination process of the respective PV cell wafer.

According to embodiments of the present invention, a PV cell may be mechanically toughened by segmenting its semiconductor body, composed of semiconductor substrate/wafer, into micro PV cells. The micro PV cells may be formed by segmenting the PV cells body completely in a repeating pattern which forms the micro PV cells. Repeating pattern may be composed of one or more set of cutting/scribing lines that form discrete functional areas. Each of the micro PV cells may be electrically connected to other micro PV cells, forming an array of micro PV cells, and the collection or array of micro PV cells working together may perform substantially same function as the original PV cell. Deposition of the gap filler material between sidewalls of the micro PV cells in a micro PV cell may produce a toughened PV cell with similar electrical characteristics not substantially different to the original PV cell prior to material separation, but having considerably better toughness characteristics and flexibility characteristics when compared to the original PV cell. The addition of the toughening material may increase, decrease or have no effect on performance of the original PV cell.

According to embodiments of the present invention, there may be provided one or more micro PV cells with dimensions (e.g. lengths, widths and thicknesses) in the millimeter range. The one or more micro PV cells may be provided with a width ranging between a fraction of a millimeter and several centimeters. A top and bottom surface of a micro PV cells may be provided in various shapes including: triangle, circle, square, rectangle, hexagon and any otherwise suitable polygon. According to embodiments of the present invention, a micro PV cell may be provided with dimensions and geometry (i.e. length, shape, width and angles) selected to allow a maximum bending moment of at least 600% that of the semiconductor substrate before toughening.

Embodiments of the present invention may include various PV array applications which are: (1) weight sensitive, (2) involve "high" or repetitive mechanical loading, and or (3) may require the use of irregularly shaped surfaces with contours as the mechanical support for the PV array. According to some embodiments, the micro PV cells may be laminated and used as a sail. According to further embodiments, the array may be affixed to the side of a building or temporary structure (e.g. tent). The array may be placed on a walkway or roadway. According to some embodiments, the micro PV cells may be spread at a low density across a wide area of transparent material, such as glass or plexiglass to provide a relatively transparent building or car envelope which also produces electricity. According to further embodiments, arrays of micro PV cells may be orientated in a vertical direction and placed behind structured prisms, pyramid arrays or lenticular lenses to provide electricity from sunshine arriving from above and presenting/projecting a billboard image to observers passing by below.

According to further embodiments, at least one sidewall or side-surface of a micro PV cell according to the embodiments may be produced with a non-right, sloped angle relative to the active surface of the micro PV cell. A sidewall or side-surface of a micro PV cell according to embodiments of the present invention may include one or more coatings of material different from the material of the rest of the cell. According to embodiments, the coating may be part of a passivation layer on the sidewall. According to further embodiments, the sidewall coating may be part of an electrical insulation layer on the sidewall. According to yet further embodiments, the coating layer(s) may have additional functionalities and may be part of any another type of layer, such as for example an anti-reflection layer, etc. According to some embodiments, the coating layer(s) may be formed in-situ, for example during dicing or cutting of the sidewall. The coating may be intentionally deposited or may be otherwise formed, for example from a reaction which occurs during cutting (e.g. lase cutting) of the sidewalls in the presence of reactive gases. The presence of reactive gasses or other gap filler agents/materials intended to infuse and react within or around the gap during laser cutting may be intentional according to some embodiments.

Micro PV cells according to embodiments of the present invention may be arranged into interconnected arrays of micro PV cells. Arrays according to embodiments of the presentation may be one, two or three dimensional. According to some one and two-dimensional embodiments of the present invention, adjacent micro PV cells within an array of micro PV cells may be spaced at some distance apart from one another, for example between 0.01 and 2.0 millimeters apart. Space in between sidewalls of adjacent cells may be left empty or may be filled with a gap filler material, which material may be a flexible and/or a compressible material. The gap filler material may have additional properties and may perform additional functions, such as for example providing electrical insulation and or providing mechanical shock protection to the micro PV cells. According to further embodiments, the gap filler material filling the gaps between adjacent micro PV cells may include an additive to trigger passivation of exposed silicon sidewalls.

Adjacent micro PV cells may be electrically connected to one another via flexible electrical conductors, which may carry both positive and negative charge from the cells, either in parallel or in series configurations. Adjacent micro PV cells may share at least one common electrically conductive connector, such as for example a positive terminal. Bottom surfaces of each of two or more adjacent micro PV cells, such as for example the respective cell's respective P-type semiconductor regions, may connect to the same electrical connector. According to further embodiments, a shared electrical conductor may be integral or may otherwise include a P-type semiconductor layer with which each of two adjacent cells may form a separate PN junction.

Large numbers of micro PV cells forming an array may be interconnected by a network of positive and negative conductors. Some arrays of micro PV cells according to embodiments of the present invention may include hundreds, thousands and even billions of micro PV cells arranged along a common surface in either one or two dimensions for example when fabricated on a roll of hundreds to thousands of meters length. Some embodiments may include micro PV cells arranged in three dimensional arrays, with multiple layers of two-dimensional arrays placed or stacked on top of each other, where gaps between micro PV cells in the upper layers of the 3D array may allow for light to pass through and onto PV cells in the lower regions. This 3D array configuration may be referred to as stacked arrays.

According to further embodiments, different groups of micro PV cells within an array of micro PV cells may be interconnected according to different arrangements, wherein some groups of cells may be interconnected to adjacent cells in parallel while other groups may be interconnected to adjacent cells in series. According to further embodiments, a micro PV cell may be interconnected with one adjacent cell in parallel and at the same time interconnected with another adjacent cell in series. Such multi-method interconnects within an array may provide for a combination of voltage boosting, due to serial interconnections, and current aggregation, due to parallel interconnections. Selection of a conductor mesh configuration, out of many possible combinations, during micro PV cell array fabrication may be performed in accordance with rules intended to customize array electrical output parameters, such as output voltage and output current for a given power level. One specific application of such array output engineering, by conductor mesh selection, is boosting voltage to current ratios for a given power in order to minimize resistive loses during transmission of the PV generated electricity.

According to some embodiments, an array of micro PV cells may be produced by physically splitting or separating a larger PV wafer or cell into smaller adjacent micro PV cells. The processing or mechanical splitting a PV Cell can also be referred to as singulation and may be performed by various processes including: (a) mechanical sawing or dicing (normally with a machine called a dicing saw); (b) scribing and breaking; (c) laser cutting (e.g. using CW laser or pulsed lasers in the UV, VIS or IR ranges); (d) E-Beam cutting; (e) Ion Beam Cutting; (f) wet etching; (g) dry etching; (h) ultrasonic cutter; (i) milling and (j) Thermal Laser Separation (TLS). Any process for singulation of semiconductor material, known today or to be devised in the future, may be applicable to present invention.

Some or all of the methods of PV cell singulation, according to embodiments of the present invention, may be automated to ensure precision and accuracy to producing micro PV cells with intended dimensions. Accordingly, dicing saw and or laser spot width or mask geometry may be selected to correspond to an intended gap size and shapes between the micro PV cells. Cutting angles may also be selected to correspond to intended slopes and or shapes of micro PV cell active surfaces and sidewalls. The micro PV cell created by a mechanical dicer saw may be any shape comprised of straight lines, but are typically rectangular or square-shaped but can also be other polygons. In some cases, when lasers or other methods are used, the micro PV cells can be produced in the form of many other shapes. A full-cut laser dicer may produce an array of micro PV cells in a variety of shapes, not just those formed of straight lines.

According to some embodiments, singulation or cutting or dicing of a PV cell or wafer into an array of micro PV cells may be performed from a top surface of the wafer or PV cell to be parsed into an array of micro PV cells. According to further embodiments, singulation or cutting may be performed from a from a bottom surface of the wafer or PV cell to be parsed into an array of micro PV cells. It should appreciated that the terms singulation, cutting, dicing, and the like, as used in this application, may be used interchangeably unless there is a specific reference to specific methods and or its inherent features. According to yet further embodiments, singulation or cutting may be performed from both top and bottom of the wafer or PV cell; in this case the cutting map or pattern on the top and bottom sides of the wafer may be the same or different. The singulation map or pattern of a PV wafer may be designed in correspondence to constraints such as the location of electrical conductors and contact points of a system to which the singulated PV wafer is to be attached.

Additional embodiments of the present invention may include an encapsulation of an array of interconnected micro PV cells within a material or set of materials. According to embodiments, a first set of materials placed in contact with a bottom surface of a micro PV cell array may join with and adhere to a second set of materials placed above a top surface of the PV cell array. Either the top or bottom set of materials may also include or act as a gap filler for spaces in between adjacent cells. The materials placed above the top of the array, where the photo-active surface is located, are selected to be sufficiently strong, flexible and sufficiently transparent to the relevant wavelengths in solar radiation in order to produce a strong, durable, flexible, conversion efficient and easily installable PV sheet or product. The materials placed below the bottom surface of the micro PV cell array are selected for strength, durability, flexibility and compatibility with the array material and with the top encapsulation material. At least one of the set of materials, either above or below the PV cells array may be composed of a stretchable and or compressible to allow the total stack to curve to a desired radius. The layers above the PV cell array need to protect the PV micro cells against corrosion, and mechanical shock (such has hail impact, heavy loads e.g. trucks etc.) and to insulate even for series connected cells with high voltage against the ground (e.g. 600VDC, 1000VDC, 1500VDC) in dry and wet conditions. The bottom layers may protect the PV micro cells against corrosion, and mechanical shock (such has hail impact, heavy loads e.g. trucks etc.) and to insulate even for series connected cells with high voltage against the ground (e.g. 600VDC, 1000VDC, 1500VDC) in dry and wet conditions.

The process of encapsulating a micro PV cell array may also be referred to as lamination (usually when this process also includes adhesion of the PV Cell Array to a material usually in sheet or roll form). Lamination of a micro PV array according to embodiments of the present invention may include placement below the micro PV array: (a) bottom encapsulant film, and (b) a back-sheet film, in that respective order. Lamination of a micro PV array according to embodiments of the present invention may also include placement above the micro PV array a top encapsulant film and then a front-sheet film. Both encapsulant films may be composed of highly adhesive and malleable material, optionally adhesive and malleable when heated. Both the top and bottom sheets may be composed of durable materials. The top sheet and top encapsulant may both have low photon attenuation properties for photons with wavelengths within a band of wavelengths at which the micro PV array operates (i.e. converts photons into electricity). In addition to the typical structure described here consisting of a backsheet, a bottom encapsulant, a PV Cell Array, a top encapsulant and a topsheet, the structure would also typically contain elements for electrically connecting the PV Cells to each other, for connecting PV Cell Arrays to each other, and for electrical connections to an external load, thus allowing utilization of the electrical power produced by the PV cells.

According to embodiments of the present invention, the top and or bottom sheets may be elastic. Either the top sheet or the bottom sheet, or both sheets may be flexible. Either the top sheet or the bottom sheet, or both sheets may be compressible. Elasticity of either top, bottom or both sheets may provide for rollability of the laminated micro PV arrays. Elasticity of either top, bottom or both sheets may provide for placement on the laminated micro PV arrays on top irregular or contoured surfaces.

A top sheet, according to further embodiments, may include optical concentrators positioned over areas where the micro PV cells are located. Each optical concentrator may cover one or more rows of Micro PV cells. Each optical concentrator may cover one or more columns of Micro PV cells. Each optical concentrator may cover one or more clusters of Micro PV cells. Or, each optical concentrator may be a micro-concentrator and may cover only one micro PV cell. Optical concentrators may be affixed to the top sheet, either before, during or after the lamination process. Optical concentrators may be embossed on the top sheet, either before, during or after the lamination process. According to some embodiments, optical concentrators are embossed or pressed onto a top sheet by a heated roller with protrusions in the shape of the optical connector, optionally during the lamination process. According to other embodiments, optical concentrators are formed onto a top sheet by micro-machining, laser ablation, patterned chemical etching or other processes.

According to some embodiments, singulation and lamination can be performed as part of a continuous process. According to further embodiments, forming of the optical concentrators may also be performed during the lamination process. According to alternative embodiments, different phases of producing an array of micro PV cells may be separated into discrete processes.

According to further embodiments, an electrical conductor mesh may be provided in a form a conductive backsheet, between the supportive backsheet and toughened PV cell array (arrays of micro PV cell arrays). This conductive backsheet may provide for electically connecting cells with soldering, conductive adhesive, circuit, bus bars, electronics inside module such as mppt tracking ICs and method of producing e.g laser ablation conductive stickers, smt etc.

According to some specific Photovoltaic focused embodiments, there may be provided methods of processing rigid (typically crystalline/polycrystalline cell of thickness above 10 um and preferably above 50 um) solar cells, of various configurations, in order to toughen and render more flexible the processed cell. The processed cells may then be used to produce flexible solar films and rolls of solar films based on a combination of these now flexible solar cells with encapsulating materials. The method can include producing long continuous films with modular electrical connections throughout in a roll format.

In order to render a rigid/ semi rigid solar cell into a flexible one, a pseudo-singulation by grooving/dicing/cutting/breaking/cleaving (hereafter called "grooving") stage may be performed on a PV cell. Provided that the current collectors of both polarities remain intact and allow electricity flow out of the cell, the grooving may be done in steps similar or larger than adjacent current collectors of opposite sign during this stage, a minimal reduction in overall efficiency is expected. Grooving may preferably done in electrically shaded sections of the solar cell to the maximum possible way in order to preserve maximum efficiency.

The distance between grooves determines the maximum radius of curvature of the film. In one preferred embodiment the distance between grooves is equal to the distance between adjacent conductors. In another embodiment the distance is between 100 um and 10 cm and preferably between 0.5 mm and 5 mm.

The kerf left by the grooving process may be minimal and may allow for the rolling of the film only in one direction in order not to apply stress and break the top of the solar cell when bending it inward. The kerf maybe of a defined width of between 0 and 300% of the height of the solar cell, to allow any desired radius of curvature when bending towards the top of the solar cell. To clarify terms: the top of the cell is the side which interacts with solar radiation.

The grooving may be performed perpendicular to the machine direction to allow rolling of the film in a small radius, parallel to the machine direction to allow flexibility in the width direction, or both to allow flexibility in all directions. The grooving can be made in diagonals, hexagons or any other pattern to render the flexibility needed by the product. Grooving may be conducted in one direction, in two directions or in more than two directions. Grooving may be conducted with an equal or with a different index in the different directions. The grooving index in any given direction may be constant or may vary.

In some embodiments, the grooving may be done by a mechanical saw or by a gang of mechanical saws (e.g. a dicing saw). Alternatively, in another embodiment, grooving may be conducted by means of a "water jet" (high speed concentrated jet of liquid with or without abrasive particles in the liquid).

In another embodiments, the film may enter a curved space with bumps or other indentations or protrusions that induces breakage in the desired locations as depicted in drawing 4C in one direction and may be induced to break in the other direction by entering a roller system with bumps at the correct index. The PV units may be pre-weakened in specific desired locations either mechanically or by means of a laser, for example. In certain embodiments, the wafer would be stressed or grooved in direction(s) corresponding to the crystal lattice of the semiconductor material thus enducing "clean" breakage along crystal planes.

In yet another embodiment the grooving may be done by laser. Preferably, the laser is capable of rastering through the pattern in alignment with the speed of the machine (web) with enough power to perform grooving deep enough and fast enough. In another embodiment the laser beam is split by a e.g. a DOE to perform parallel grooving of between 2 to 1000 beamlets or more. The laser may be rastered and or split optically or mechanically e.g. by an SLM or by any other beam shaper and or a mechanical head. In further embodiments more than one laser head may be used in order to increase throughput, i.e. perform a higher number of grooves of specified depth, width, shape, angle and index in a given amount of time.

In one embodiment, a process for producing a product as described herein, is exemplified in which individual photovoltaic cells are first attached to a continuous flexible support sheet in an e.g. "pick and place" or dispenser manner and electrically connected to each other, either directly or by means of separate connecting elements. In one variation, the support film or sheet would already have electrical connecting elements preplaced on it in the correct locations to electrically connect adjacent photovoltaic elements/solar cells. This process would typically be a continuous process fed by a roll of support material with an automated station for placing the individual photovoltaic units and a station for performing the electrical contacts. The support sheet with the electrically connected photovoltaic elements is then moved to a pseudo-singulation (e.g. scribing, dicing, grooving etc.) station which would typically, but not necessarily, be located directly after the electrical contact station. The pseudo-singulation station is equipped with a mechanical (e.g. dicing saw) or laser unit, or both, or other means such as a water-jet or controlled breaking with capabilities to pseudo-singulate in at least one direction. The pseudo-singulation unit may be in a "gang configuration" enabling multiple scribes and or cuts in a single pass of the machine head. Relative movement between the scribing/cutting head(s) and the photovoltaic elements in the machine direction may be accomplished by continuous movement of the support sheet. The machine head may be capable of conducting all scribes and cuts in a single pass or may have the capability to move in the transverse direction to reposition itself at a location required to perform additional scribes and or cuts in the machine direction. The production line may be equipped with more than one cutting/scribing head for use in the machine direction. Scribing and or dicing in other directions (including the transverse direction, perpendicular to the machine direction) may be performed by an additional head or additional heads with movement capability in the transverse direction. The dicing and or scribing may be performed in a step and repeat semi-continuous manner where the support sheet with the photovoltaic elements would remain stationary in the transverse direction scribing/cutting area while the transverse direction scribing/cutting is conducted. Upon completion of transverse direction scribing/cutting of a given area, the support sheet with the photovoltaic units would move in the machine direction bringing into the transverse direction scribing/cutting area an additional portion of the material for transverse direction scribing/cutting. This order is just an example, and a certain direction grooving may be performed, before, after or simultaneously with grooving in a different given direction(s). Scribing and or dicing in other directions (typically the transverse direction, perpendicular to the machine direction) may also be performed by an additional head or additional heads with movement capability in both the machine direction and the transverse direction, in which case the dicing and/or scribing would be performed in a continuous manner, with the machine head for dicing and/or scribing in the transverse direction would follow the movement of the support sheet with the photovoltaic units, and perform the scribing and/or dicing while moving in the machine direction. Upon completing certain area, the machine head would reposition itself upstream in the machine direction in order to perform the next set of transvers scribes and/or dicing cuts. Upon completion of dicing and/or scribing, the support sheet with the scribed and/or diced photovoltaic units is flexible enough to be rolled up and moved to a different line for subsequent processing or may undergo further processes downstream on the same line. The kerfs' width may be wide enough to provide partial transparency to the solar film and allow some (0.1% to 99.9% and preferably 5% to 90%) of the optical radiation to pass through it.

In some embodiments, the connector units between adjacent photovoltaic units may be spring-like and allow for stretching of the product, given that the frontsheet and backsheet have enough elasticity to enable stretching. Stretching may be in one or more than one direction.

In a next processing step, the support sheet with the scribed and/or diced photovoltaic units may be laminated to a protective top sheet and/or bottom sheet. The lamination step may include encapsulation of the photovoltaic units with a protective material such as ethylene vinyl acetate (EVA). The protective top sheet needs to be transparent in order to maximize the intensity of solar radiation reaching the photovoltaic units and have good long-term resistance to environmental conditions. ETFE is one example of a material suitable for the protective top sheet. Transparent UV epoxy is another example and in one embodiment can be reinforced by fiberglass. A top durable transparent coating such as transparent synthetic "asphalt" may also be used to support heavy loads and protect the cells from breaking in e.g. solar roads applications. A glass filler may also be used in this application to enhance durability. In one embodiment fillers would be chosen with a refractive index similar to the matrix in which they are embedded. The top sheet may also be colored or tinted in order to suit certain applications. In this embodiment, narrow bandwidth reflection particles in a particular color may be embedded within the top sheet. In another example a holographic diffraction induced color may be generated through particles and geometries inside the sheet that induce color in certain directions and may in some cases also be transparent in other directions. In another embodiment the top sheet may include embedded lenses (e.g. microlenses) to concentrate the received radiation only upon the active area of the cells (i.e. excluding the kerfs formed when grooving and/or the area of the chamfered corners of the individual photovoltaic units/silicon wafers).

In another embodiment, relative movement between the scribing/cutting head and the photovoltaic elements in the machine direction may be accomplished by continuous movement of the support sheet. The machine head may be programmed to scribe and/or dice in a "Zig-Zag" pattern by combining mechanical movement of the head in the transverse direction and optical and/or mechanical manipulation of the laser beam in the machine direction. Combining consecutive lines of "Zig-Zag" scribing/dicing results in an array of scribes/cuts along both diagonals of the PV unit. Upon completion of dicing and/or scribing, the support sheet with the scribed and/or diced photovoltaic units is flexible enough to be rolled up and moved to a different line for subsequent processing or may undergo further processes downstream on the same line. In yet another embodiment relative movement between the scribing/cutting head and the photovoltaic elements in the machine direction may be accomplished by continuous movement of the support sheet. The machine head is programmed to scribe and/or dice in a hexagonal pattern by combining mechanical movement of the head in the transverse direction and optical and/or mechanical manipulation of the laser beam in the machine direction. Consecutive lines of partial hexagonal scribing/dicing trajectories result in an array of scribes/cuts that form a complete hexagonal ("bee hive") pattern across the PV cell in order to achieve better ration between cut and intact areas on the original cell to optimize performance. Upon completion of dicing and/or scribing, the support sheet with the scribed and/or diced photovoltaic units is flexible enough to be rolled up and moved to a different line for subsequent processing or may undergo further processes downstream on the same line. Patterning is not limited to the "Zig-Zag" or hexagonal grooving patterns described here and may include other geometrical trajectories and combinations thereof.

Various automated machines can be used to produce the flexible solar rolls based on treated rigid/semi rigid solar cells. In general, the machine can produce flexible solar films using any solar cell in which the both conductors are placed on the bottom of the cell such as, interdigitated back contact (IBC) solar cells, metal wrap through (MWT) solar cells, Emitter Wrap Through (EWT) solar cells, or other types of solar cells.

In one embodiment, monocrystalline, polycrystalline and/or any other type of silicon-based solar cells can be used.

In one embodiment the carrier sheet (e.g. backsheet and/or encapsulant sheet) may be stretchable and may be first metallized e.g. with (non-stretchable or stretchable) contact. A solar cell without the metallization is placed upon this metalized and patterned substrate in the correct placement and subsequently cut with minimal kerf and preferably no kerf (e.g. by breaking). A kerf is subsequently created by stretching the carrier sheet and thus moving the areas with active photovoltaic material away from each other.

In yet another embodiment an identification tag such as a RFID may be embedded in the product to allow for smart control and antitheft of the product. the adhesive of the film layers may be designed to prevent the opening of the cells without tearing apart and ruining the cells. Designing the antitheft electronics adjacent to the cell with adhesive designed to destroy it in case of tampering will prevent cutting and taking only part of the cell array.

In another embodiment the top sheet and/or encapsulant may be metallized in a fine line, stretchable or not, and subsequently electrically connected to the top of the solar cell, which in this case has one electrode on the bottom and the other at the front such as standard type silicon photovoltaic cell.

In one embodiment, the machine is a R2R (roll-to-roll) type system where at the end of the process the solar film is rolled onto a core to be packed and shipped. Packing and shipping may be in the form of "Jumbo rolls" (the full size of the incoming support roll) or in the form of smaller rolls which may be slit from the full-size roll in both the machine direction and/or the transverse direction. Packing and shipping of the end product is expected to be limited only by practical constraints of handling—weight, availability of raw materials in required widths, maximized efficiency of packing rolls in a shipping container, etc.

In some embodiments, the backside of the product would be coated with an adhesive (e.g. pressure sensitive adhesive, PSA) and laminated to a release layer to ensure that no contamination of the PSA occurs. The functionality of the adhesive is to facilitate easy attachment to a substrate (wall, car roof, etc.).

In one embodiment the machine may include a soldering station where individual cells are electrically connected in series and parallel in order to reach the desired current and voltage of the film/module. The soldering process may be done in several stages during the fabrication of the module. In one example bypass diodes, jumpers, smart logic, transistor, ideal diode circuits, cell-wise (or few cells) mppt circuitry, and more may be used inline in the connection and soldering between cells to allow e.g. mppt of cells in different orientation (due to flexibility), antitheft electronics, rapid shutdown logic, AC current inversion, as well as bus bars and communications. The connectors between cells and solder are designed to meet environmental conditions as well as expansion due to temperatures with low fatigue.

In order to allow production at higher speeds, the soldering stations may be distributed along the line and do not need to perform the electrical connection at the same time. In further embodiments, soldering may be replaced fully or partially by the use of electrically conductive adhesives.

In one embodiment the solar cells after grooving and soldering may be ready for encapsulation by encapsulants (e.g. polymer encapsulants, foil encapsulants, liquid encapsulants, vapor encapsulants or other types and combinations thereof), of the back sheet and front sheet at the next station of the machine.

In one embodiment the grooved cells may pass through a passivation stage to either passivate dangling bonds in the exposed silicon, protect it and or create a field that pushes carriers away similar to the one on the top surface of e.g. IBC cell. This may be done by form of e.g. ALD, CVD, PVD, wet or other technique of e.g SiO2, SiNx, AlOx TiO2 among others.

In one embodiment the system does not need encapsulation at all, or at least in the sense of humidity, oxygen or other environmental corrosion agents due to the inherent stability of the components and expected life time that satisfy the requirements of a given application.

The encapsulation material(s) may include EVA, a fiberglass-reinforced composite and/or fluorinated polymer e.g. ETFE or in another embodiment, a polyolefin or any other appropriate material. The encapsulation can be composed of one layer or more than one layer of different polymers, or other dielectric materials such as oxides, nitrides, etc. to render the encapsulation (electrical and chemical), flexibility and optical properties needed for the product, and meet necessary standards. e.g. withstand 1500V breakdown voltage, allow only low degradation of performance for tens of years, withstand mechanical impact such as hail etc.

One or both of the frontsheet and the backsheet can be transparent. Areas for connecting peripherals may be designed in the front and/or back sheets for contacting bus bars, auxiliary electronics etc. These may be fabricated as e.g. holes or as weak spots that allow a penetration of a connector designed to provide good electrical connection.

The busbars may be designed as metalizations e.g metal foil laminates between the front and backsheet/ and or encapsulant film and to provide a pocket like area for the connection of a penetrating and expanding electrical connection that may sit once attached between the two metalizations with a compressive stress e.g. spring or washer spring to it's place and subsequently it may be sealed as well.

In one embodiment, the electrical connection to photovoltaic units and between adjacent photovoltaic units may be conducted at a later stage by a machine capable of penetrating either the frontsheet and/or the backsheet, performing the desired electrical connection, and retracting without leaving damage to the said sheet. The process may include a post-electrical connection "healing step" in which damage to the frontsheet or backsheet is repaired by an encapsulation material or by other means.

The flexible solar films may be designed to be cut at certain shapes and lengths as required by the application and not necessarily be in only one form factor as the state of the art. They may be cut to shape at the installation location.

The flexible solar film sizes may be scalable with sizes between 1 mm and 100 km, and preferably between 12 m at 24 km it the roll direction and between 1 mm and 10m, and preferably between 12cm and 4 m in the perpendicular direction.

The flexible solar film may be constructed in a modular fashion allowing for different combinations and connections of PV cells to create areas capable of generating a required voltage and current combination.

Embodiments of the present invention may include a toughened semiconductor substrate comprising a substrate body composed of at least some brittle semiconductor material having a thickness of above 0.01 mm. The semiconductor material may have top, bottom and side surfaces. At least one intentionally placed gap may be introduced into said substrate body, wherein said intentionally placed gap may be at least 10% of semiconductor material thickness deep and at least 10% of semiconductor thickness wide. The toughened substrate may include a gap filler within the at least one intentionally placed gap which may be composed of a softer/tougher material possessing compressible/stretchable and/or flexible mechanical properties. According to embodiments, the gap filler may convey or introduce mechanical impact or force absorption and/or toughening properties to the composite semiconductor substrate as well as rendering it flexible.

The toughened semiconductor substrate semiconductor body may be composed of at least one semiconductor material selected from the group consisting of: intrinsic semiconductors, Group IV semiconductors, III-V semiconductors, II-VI semiconductors, silicon, silicon dioxide, aluminum oxide, sapphire, germanium, gallium arsenide (GaAs), and indium phosphide (InP) germanium, C, SiC, GaN, GaP, InSb, InAs, GaSb semiconductor on glass, silicon on glass, glass, silica, alumina, quartz, gallium arsenide (GaAs), and indium phosphide (InP), CdTe, organic/inorganic perovskite based materials, CIGS (CuGaInS/Se) including doped versions of the aforementioned materials and mixtures thereof.

Composite substrate bodies may include epitaxcsial semicondoctorssemiconductors on glass: CIGS (Cu In Ga S/Se) on glass AZO/ZnO/CIGS on glass, FTO/ZnO/CIGS on glass, ITO/ZnO/CIGS on glass, AZO/CdS/CIGS on glass, FTO/CdS/CIGS on glass, ITO/CdS/CIGS on glass, FTO/TiO2/CIGS, CdTe on glass, glass AZO/ZnO/CdTe on glass, FTO/ZnO/CdTe on glass, ITO/ZnO/CdTe on glass, AZO/CdS/CdTe on glass, FTO/CdS/CdTe on glass, ITO/CdS/CdTe on glass, FTO/TiO2/CdTe.

The semiconductor body may be configured to produce a semiconductor device selected from the group consisting of: a Photo Voltaic Cell, a Light Emitting Diode, a Transistor, a Power Transistor, an Integrated Circuit, a Very Large Scale Integration, a detector, a diode and a Microelectromechanical systems (MEMS).

According to embodiments, the gap filler may be composed of at least one material selected from the group consisting of: (a) a polymer; (b) a resin, (c) amorphous silicon; (d) glass; (e) a metal; (f) carbon; (g) oxygen; (h) a monomer; (i) a second semiconductor; (j) an oligomer; (k) a reactive system (e.g. monomer and photo-initiator); (I) EVA; (m) PVDF; (n) Silicone; (o) a fluoropolymer, (p) SiNx, (q) EPDM, ® rubber, (s) PDMS, (t) PFE, (u) nitrogen, (v) titanium, (w) TaN, (x) AlN, (y) organic compound, (z) inorganic compound, (aa) nitrides, (ab) phosphides, (ac) carbides, (ad) selenides, (ae)halcogenides, (af) halides and (oag) a combination of 2 or more of the above.

Gap filler comprised of an elastic or a plastic filler may include (a) a polymer, (b) a resin, (c) a monomer, (c) an oligomer, (e) PDMS, (f) EVA, (g) PFE, (h) a reactive system (e.g. monomer and photo-initiator, (i) PVDF, (j) Silicone, (k) EPDM and (l) rubber. Gap filler comprised of an passivating material may include: (a) SiNx, (b) SiO2, (c) AlN, (d) TaN, (e) nitrides, (f) phosphides, (g) carbides, (h) selenides, (i) halcogenides, (j) halides, (k) amorphous silicon. Gap filler comprised of composite material for chemical, thermal and mechanical durability may include at least one of the following materials: a) a metal, b) carbon, c) ceramic material. The gap filler may be comprised of any combination of the above listed options.

According to embodiments, the gap filler material may be reactively grown within a respective gap. The gap filler may be formed by reacting some gas or other substance with wall material of the gap sidewall. The gap filler may form a coating on said gap sidewall. The coating on said gap walls may be formed by the reaction of sidewall material with a specific ambient (e.g. gas) provided during the cutting/dicing process, for example during laser cutting.

According to embodiments, the gap filler may physically expand and may push gap walls apart. The gap filler may expand during reaction with material from the sidewalls. Alternatively, the gap filler may be introduced into the gap as a mixture of reactive materials which expand from reacting with themselves.

The toughened semiconductor substrate may include a gap filler mixture with anisotropic particles affixed in a specific direction relative to the top or bottom surface or any other specific plane in the substrate.

The toughened semiconductor substrate may include gap filler composed of materials deposited as discrete layers within or across a gap. The Deposited material(s) may lay essentially parallel to the top and bottom surfaces of the semiconductor substrate, or parallel to any other direction, including vertically to the top and bottom surfaces of the substrate. Different layers of the deposited discrete layers have different properties and serve different toughening functions.

According to embodiments, the toughened semiconductor substrate may include intentionally placed gap produced by removing material from the substrate body. The intentionally placed gap may extend across at least the top surface of said substrate body in a single line or in a pattern composed of an array of lines or other shapes. The array of lines may intersect at different points to create discrete areas of the top surface separated from adjacent similar discrete areas.

The toughened semiconductor substrate according to embodiments may include an intentionally placed gap which extends across each of the top surface and the bottom surface of said substrate body, thereby forming separate and different gap patterns within each of top surface and bottom surface. Gap filler material used for filling the gap patterns within each of top surface and or bottom surface may be different, wherein one of the two gap patterns may be left unfilled.

The toughened semiconductor substrate according to embodiments may include intentionally placed gaps produced by removing material from the substrate body and which may pass completely through the semiconductor body from top surface to bottom surface. According to embodiments, the intentionally placed gap may be produced by expanding the distance between the semiconductor substrate parts from the sides of the gap.

The intentionally placed gap may be perpendicular to the top surface and to the bottom surface. The intentionally placed gap may be at an angle other than 90 degrees to the top surface and to the bottom surface. The intentionally placed may be a regular contour with flat walls. The intentionally placed gap may be of an irregular contour such a "V-shaped", "U-shaped", flat or other shape.

Embodiments of the present invention include all steps known today or to be devised in the future to provide the semiconductor features mentioned.

Embodiments of the present invention may include a mechanically toughened Photovoltaic (PV) cell comprising a semiconductor body composed of semiconductor material with a formfactor including a top surface, a bottom surface and at least one sidewall, at least one intentionally placed gap within said body; and gap filler deposited in the gap formed within the cell body. Gaps within said cell semiconductor body may extend in a pattern so as to partition said PV cell into two or more micro PV cells, each micro PV cell having a body, a top surface, a bottom surface and sidewalls.

According to embodiments, each micro PV cell may include at least two electrode contacts of said micro PV cell and each electrically connected to a different side of a PN junction within its respective micro PV cell. According to embodiments, the electrode contacts may be laterally spaced apart on a bottom surface of the micro PV cell. The micro PV cell may include at least two electrode contacts on any surface of said micro PV cell and each electrically connected to a different side of a PN junction within its respective micro PV cell.

The micro PV cell top surface may be a polygon selected from the group consisting of: (a) a square; (b) a rectangle; (c) a decagon; (d) a hexagon; (e) a heptagon; and an octagon. Each side of said polygon may have a length in the range of 0.1 mm to 5 mm. The micro PV cell bottom surface may have the same shape and substantially the side lengths as said top surface. According to embodiments, the bottom surface may have a different side lengths from that of the top surface.

A thickness of said micro PV cell, from top surface to bottom surface, may be in the range between 0.01 mm and 5 mm. At least one micro PV cell sidewall may be at a slope to said top surface or may have a curved surface.

According to embodiment a micro PV cell sidewall may be coated with a material different from the material comprising said micro PV cell body. The sidewall may be coated with a passivation material. The sidewall may be coated with an electrically insulative material. The sidewall may be coated with an electrically insulative material. The sidewall may be coated with a compound produced when reacting the cell body material with a substance selected from the group consisting of: (a) oxygen, (b) ammonia, (c) nitrogen, (d) hydrogen, and (e) argon and (f) compounds of these materials and (g) mixtures thereof.

According to embodiments, each of the micro PV cell electrodes is connected to a separate flexible conductor which interconnect corresponding electrodes on separate micro PV cells. According to embodiments, a conductive mesh may include conductors which electrically connect corresponding electrodes on different toughened PV cells.

The toughened PV cell according to embodiments may include a clear polymer laminate located above said top surface. The PV cell may include a clear top sheet and or encapsulant. The top sheet may include optical concentrators located above micro PV cells. The optical concentrators may or may not cover all or part of the gap between micro PV cells. The optical concentrators may be embossed or otherwise added to said clear top sheet. Adding may include chemical etching, micro-machining, laser ablation or other means, during or after the laminate is affixed to the PV cell.

According to embodiments, the concentrators may be geometrically optimized to direct the sunlight from an optimized inclination angle to an active area of a respective micro PV cell. The concentrators may be geometrically optimized to direct light away from non-active part of respective micro PV cells.

Embodiments of the present invention may include mechanically toughened Photovoltaic (PV) cell array comprising a bendable and or stretchable support sheet upon which two or more toughened PV cells may be arranged relative to one another. The array may include an electrical conductor mesh to electrically interconnect corresponding electrical output terminals of at least two toughened PV cells, and at least one of said toughened PV cells may be s formed of a semiconductor substrate with a formfactor including a top surface, a bottom surface and at least one sidewall, at least one intentionally placed gap within said body with gap filler deposited therein.

The array may be composed of toughened PV cells as described above. The electrical contacts may be attached to each toughened cell and may be placed upon the support sheet which includes interconnections between the toughened PV cells. The PV cells may include dot contacts dispersed through respective bottom surfaces and may include P and N contacts.

A toughened PV cell according to embodiments may include dot contacts dispersed through its bottom surface and may include p and n contacts that connect 2 or more dot contacts of the same polarity.

An array according to embodiments may include an electrical conductor mesh to electrically interconnect corresponding electrical output terminals of at least two toughened PV cells, whereas the array may also connect micro PV cells and or group of micro PV cells and or one or more toughened PV cell.

An array according to embodiments may provide a flexible PV module composed of a continuous flexible array of claim which is rollable on a roll with a diameter of less than 50 cm. The flexible module may be composed of a continuous flexible array with a length of between 0.12 m to 24 km, and with a width of between 0.12 m to 12 m.

According to embodiments, the specific weight of the PV module may be lower than 1, and it may floats on water. The array support sheet may be made from a closed cell foamed polymer. The closed cell foamed polymer may be made of a polymeric material including: polyolefin, pdms, epdm, silicone, polyurethane. The support sheet may be made out of fluoropolymer, PET, PVC, EPDM, ETFE, ECTFE, acrylic, PC, PVDF, PEF, POE, PP, PE, Al, silicone and combinations thereof. A top sheet of the array may be made out of transparent and or colored and or patterned and or embossed fluoropolymer, PET, PVC, EPDM, ETFE, ECTFE, acrylic, PC, PVDF, PEF,POE, PP, PE, Al, silicone and combinations thereof, ETFE, PET, PVDF, PP, PE, EVA and FEP.

BRIEF DESCRIPTION OF THE FIGURES

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIGS. 5B & 5C each show a series of top views of a semiconductor substrate as it transitions through exemplary separation/singulation/grooving processes in accordance with beam based embodiments of the present invention;

FIGS. 6A and 6B are bottom views of a semiconductor body according to PV device embodiment of the present invention where interdigitated positive and negative electrodes protrude out of the bottom of the substrate body, and wherein different separation/cutting patterns are used depending on a placement and arrangements of negative electrodes relative to corresponding positive electrodes;

FIG. 8A is a prospective view of a freestanding semiconductor substrate body singulated in accordance with some embodiments of the present invention and including a gap filler in the form of a coating on the gap sidewalls which may coat just gap sidewalls or may fill up to 100% of the gap volume.

FIG. 8B is a side cross-section view of several optional semiconductor body gap formation geometries which could be produced and or used in accordance with embodiments of the present invention also including a coating layer.

FIGS. 9A through 9F includes three set of top and side illustrations of a semiconductor substrate/wafer body, wherein each set illustrates a transition of semiconductor substrate/wafer body from an untoughened configuration into each of three separate toughened configurations in accordance with embodiments of the present invention (Note should be made that gaps and wafer bodies and sections are not drawn to scale);

FIG. 10B is a sideview illustration of a clear polymer embossing assembly to provide micro or mini lenses on a top sheet covering a toughened PV cell in accordance with embodiments of the present invention.

Figure 1A:
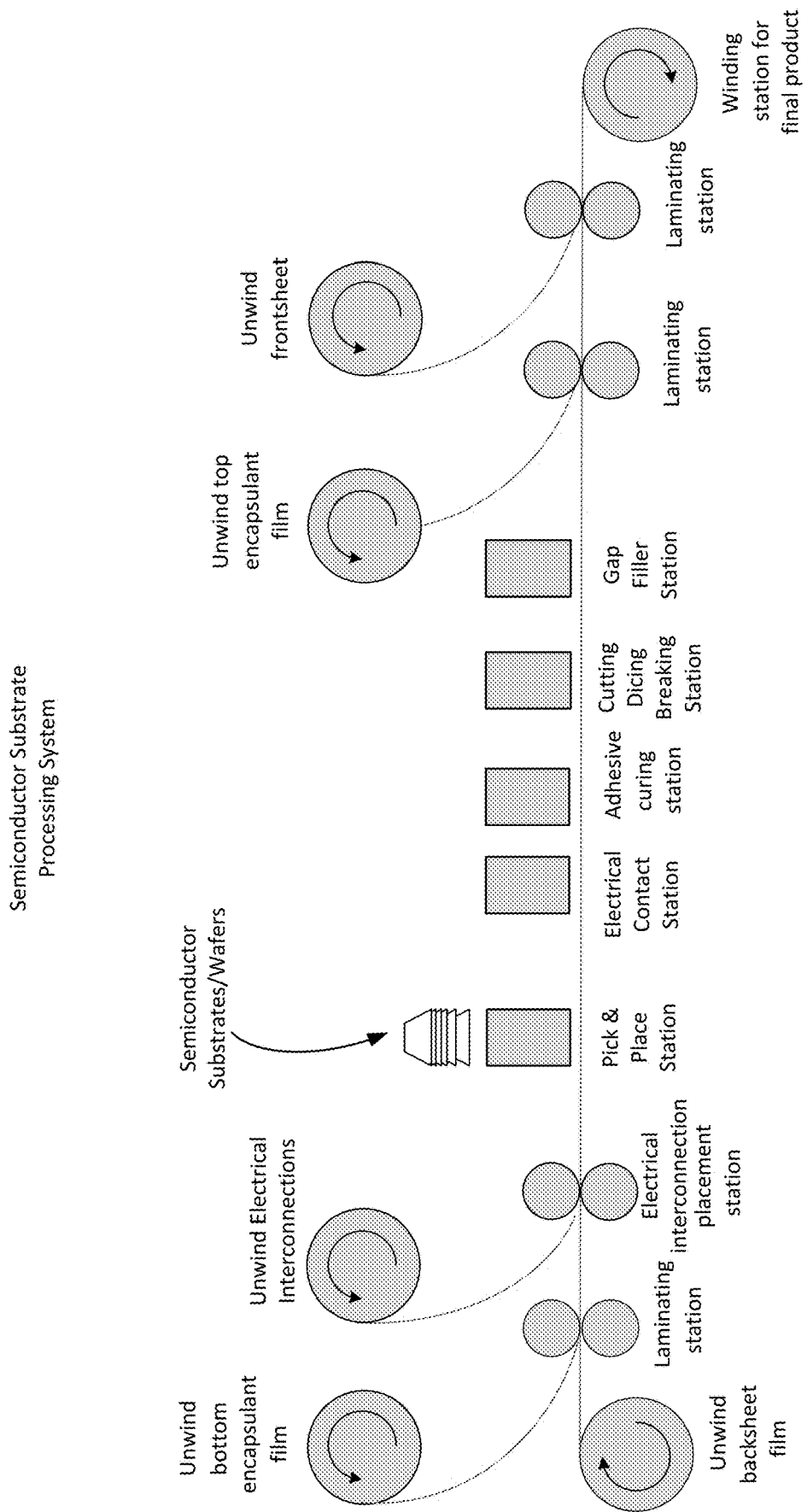
FIG. 1A is a functional level symbolic illustration of an example of a system for toughening a semiconductor substrate or wafer (wafer and substrate interchangeably used in this application) in accordance with embodiments of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE FIGURES

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing", "computing", "calculating", "determining", or the like, may refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

In addition, throughout the specification discussions utilizing terms such as "storing", "hosting", "caching", "saving", or the like, may refer to the action and/or processes of 'writing' and 'keeping' digital information on a computer or computing system, or similar electronic computing device, and may be interchangeably used. The term "plurality" may be used throughout the specification to describe two or more components, devices, elements, parameters and the like.

Some embodiments of the invention, for example, may take the form of an entirely hardware embodiment, an entirely software embodiment, or an embodiment including both hardware and software elements. Some embodiments may be implemented in software, which includes but is not limited to firmware, resident software, microcode, or the like.

Furthermore, some embodiments of the invention may take the form of a computer program product accessible from a computer-usable or computer-readable medium providing program code for use by or in connection with a computer or any instruction execution system. For example, a computer-usable or computer-readable medium may be or may include any apparatus that can contain, store, communicate, propagate, or transport the program for use by or in connection with the instruction execution system, apparatus, or device.

In some embodiments, the medium may be an electronic, magnetic, optical, electromagnetic, infrared, or semiconductor system (or apparatus or device) or a propagation medium. Some demonstrative examples of a computer-readable medium may include a semiconductor or solid state memory, magnetic tape, a removable computer diskette, a random access memory (RAM), a read-only memory (ROM), any composition and/or architecture of semiconductor based Non-Volatile Memory (NVM), any composition and/or architecture of biologically based Non-Volatile Memory (NVM), a rigid magnetic disk, and an optical disk. Some demonstrative examples of optical disks include compact disk—read only memory (CD-ROM), compact disk—read/write (CD-R/W), and DVD.

In some embodiments, a data processing system suitable for storing and/or executing program code may include at least one processor coupled directly or indirectly to memory elements, for example, through a system bus. The memory elements may include, for example, local memory employed during actual execution of the program code, bulk storage, and cache memories which may provide temporary storage of at least some program code in order to reduce the number of times code must be retrieved from bulk storage during execution.

In some embodiments, input/output or I/O devices (including but not limited to keyboards, displays, pointing devices, etc.) may be coupled to the system either directly or through intervening I/O controllers. In some embodiments, network adapters may be coupled to the system to enable the data processing system to become coupled to other data processing systems or remote printers or storage devices, for example, through intervening private or public networks. In some embodiments, modems, cable modems and Ethernet cards are demonstrative examples of types of network adapters. Other functionally suitable components may be used.

Figure 1B:
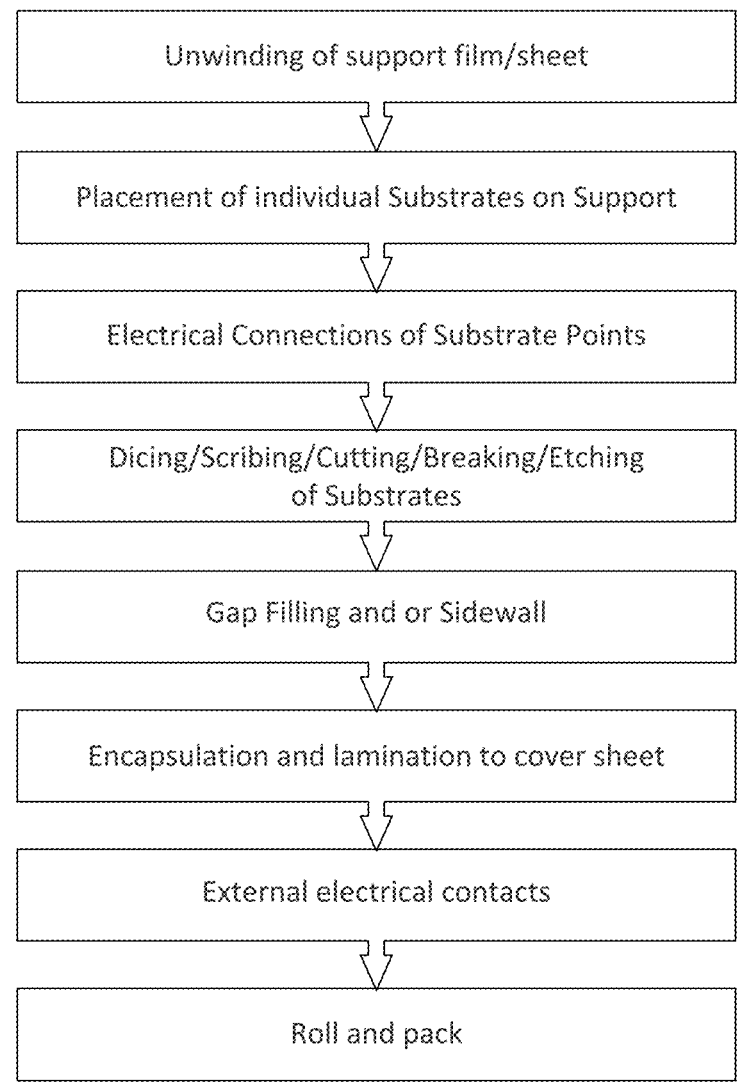
FIG. 1B is a flowchart including steps of one possible sequence of a method of toughening a semiconductor substrate in accordance with embodiments of the present invention.

Turning now to FIG. 1A, there is shown a functional level symbolic illustration of a system for toughening a semiconductor substrate or wafer (wafer and substrate interchangeably used in this application) in accordance with embodiments of the present invention. Operation of the system of FIG. 1A may be described in conjunction with steps enumerated in the flowchart of FIG. 1 B, which is flowchart of a method of toughening a semiconductor substrate in accordance with embodiments of the present invention. The specific machines/stations and the specific sequence of steps used may vary without detracting from the innovation.

A bottom support sheet along with a bottom encapsulant are unrolled and combined to form a bottom support upon which electrical interconnects, such as a conductor mesh (inter-digitated or not), are unrolled and placed. Upon the composite film and electrical support structure a pick & place machine places one or more semiconductor substrates in any configuration applicable to the present invention. An electrical contact station makes contacts between relevant electrodes on the placed substrates and corresponding conductors on the mesh, after which the bottom encapsulant is cured at an adhesive curing station. A top surface of the electrically connected and adhesive affixed substrates are separated/singulated/grooved to form semiconductor substrate body gaps in accordance with embodiments using a cutting, dicing or breaking station. The substrate gaps, which can be clean through cuts, are then filled by a gap filler material in accordance with embodiments of the present invention, at a gap filling station. A clear top laminating film and a clear top sheet are then applied and pressed together on top of the substrates, after which the output product is rolled up at a rolling station.

Figure 2A:
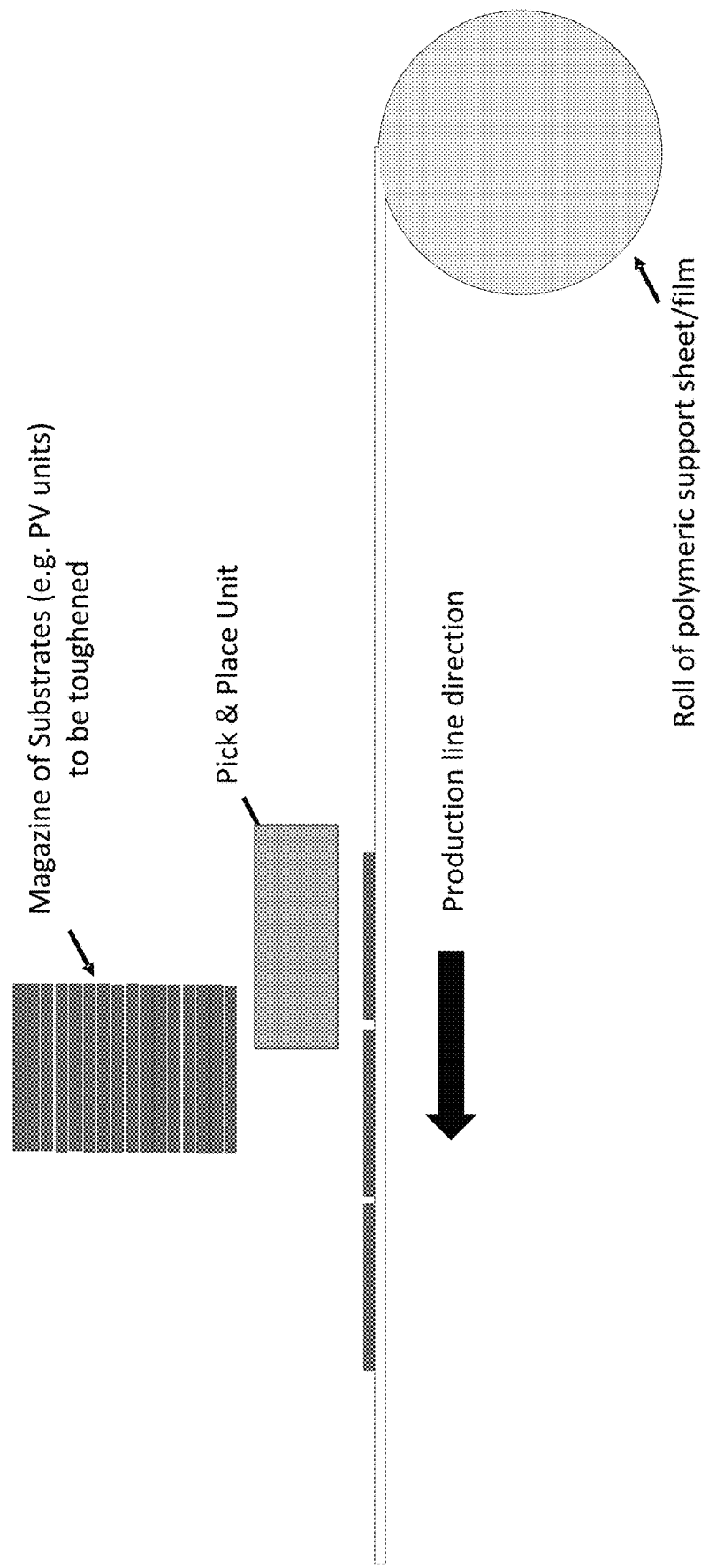
FIG. 2A is a sideview illustration of a pick & place process by which semiconductor substrates (figure refers to PV wafers as a specific example) are placed on a support sheet as part of an exemplary embodiment of the present invention.
Figure 2B:
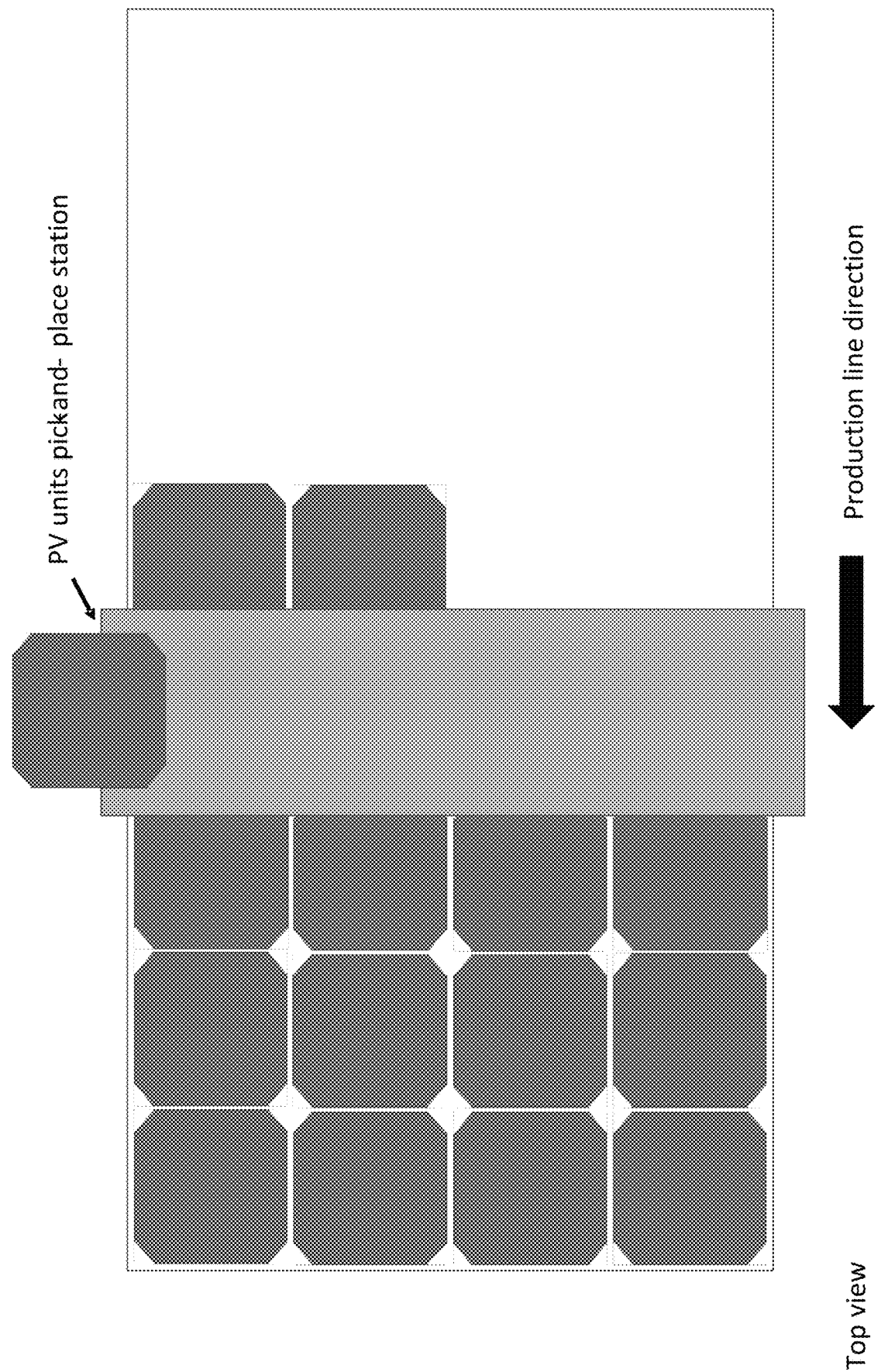
FIG. 2B is a top view illustration of a pick & place process by which semiconductor substrates (figure refers to PV wafers as a specific example) are placed on a support sheet as part of an exemplary embodiment of the present invention.

Optional processes and devices in the context of the system of FIG. 1A are shown in the following figures. Turning now to FIG. 2A, there is shown a sideview illustration of a pick & place process by which semiconductor substrates are placed on a support sheet as part of an exemplary embodiment of the present invention. FIG. 2B is a top view illustration of a pick & place process by which semiconductor substrates are placed on a support sheet as part of an exemplary embodiment of the present invention.

Figure 3A:
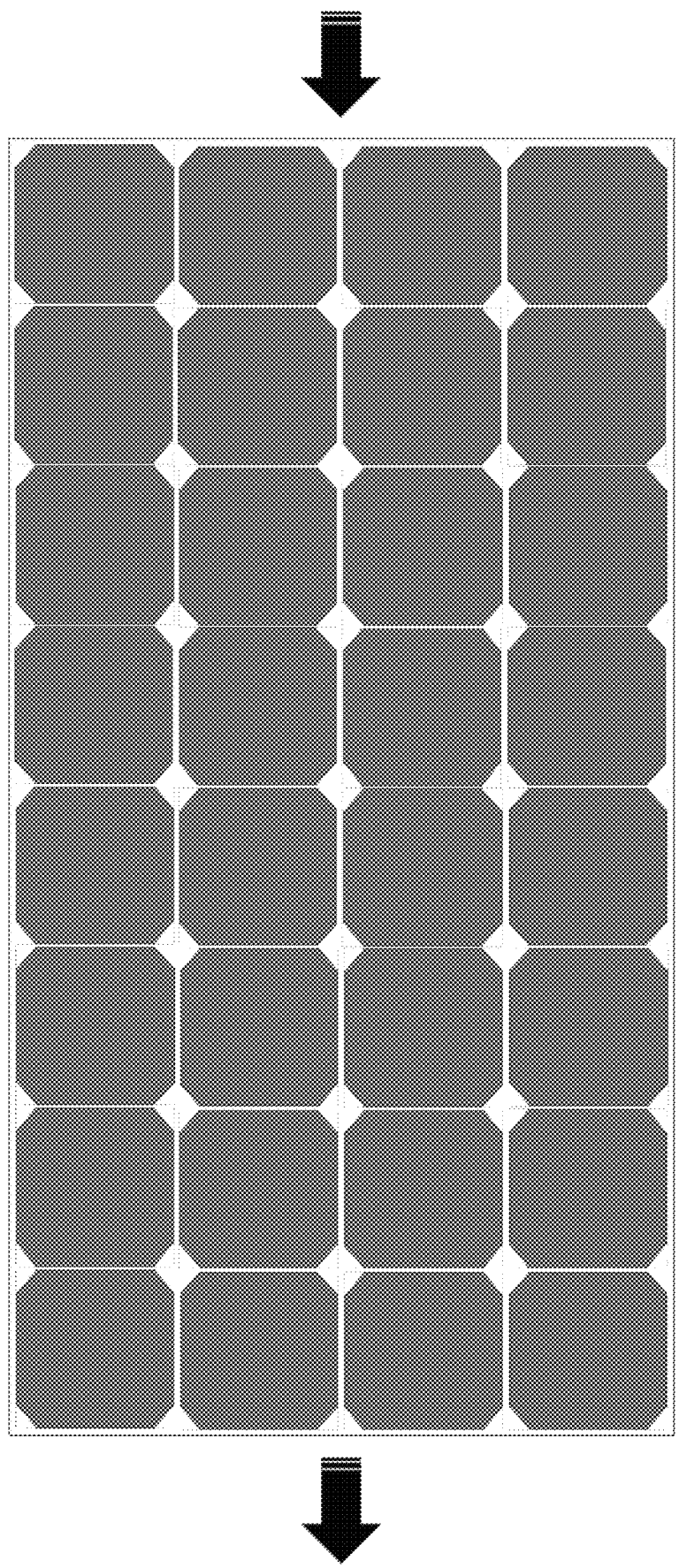
FIGS. 3A to 3C include a series of top view illustrations of a set of semiconductor substrates positioned on a supporting sheet and being separated or singulated by a physical scribing, grooving or dicing (cutting) process performed by an automated cutter at a cutting station in accordance with embodiments of the present invention.
Figure 3B:
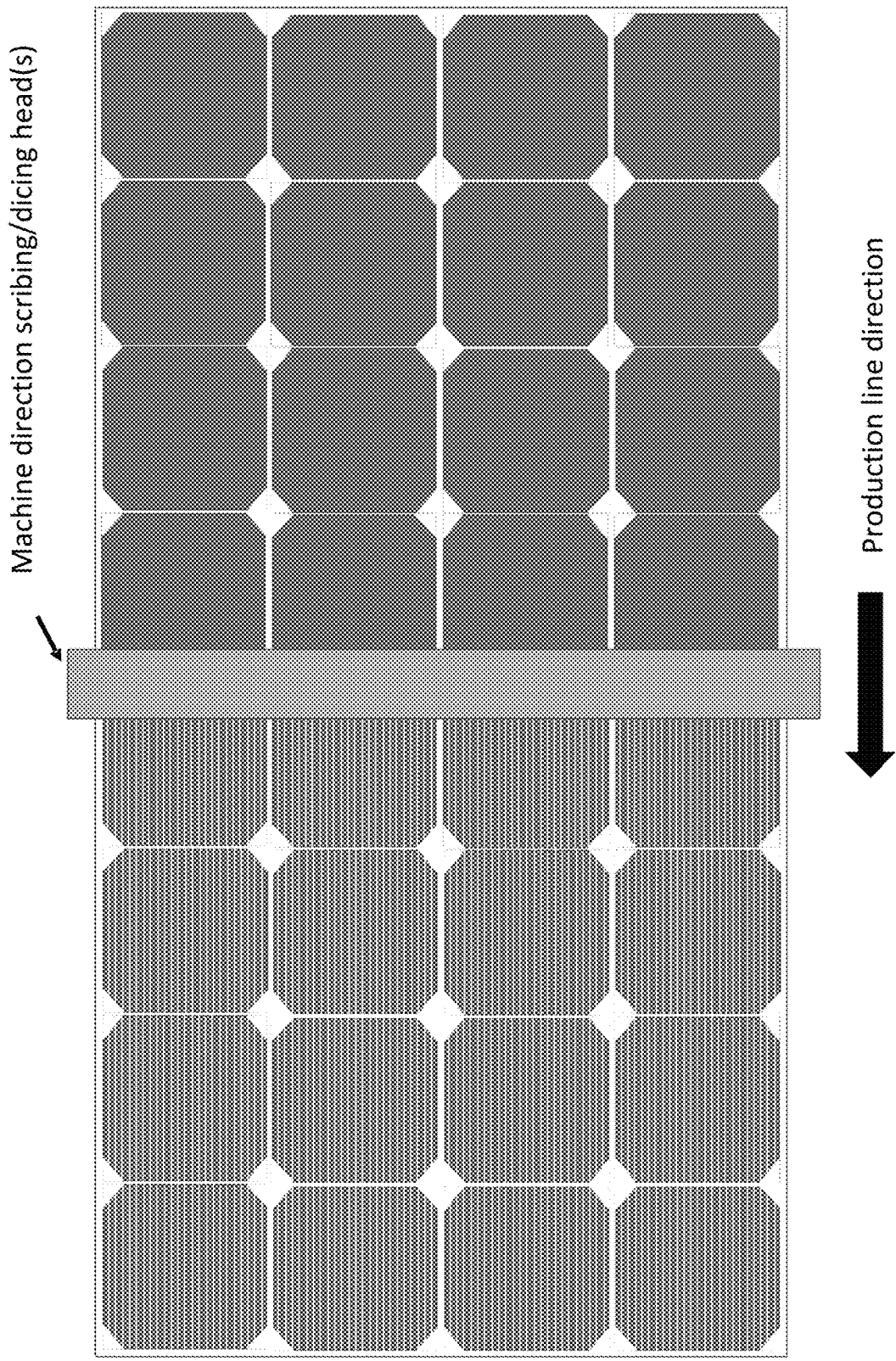
Figure 3C:
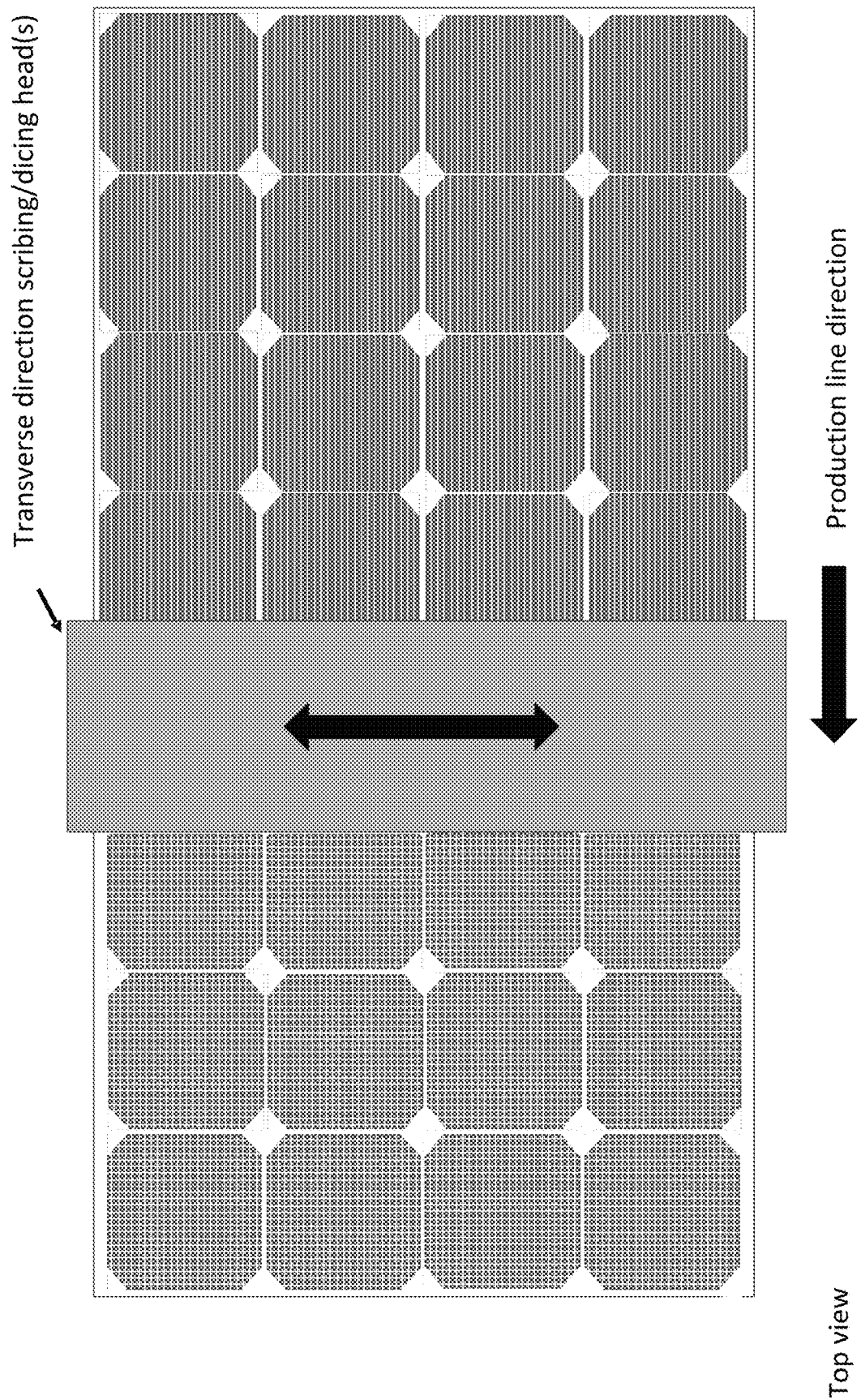
Figure 4A:
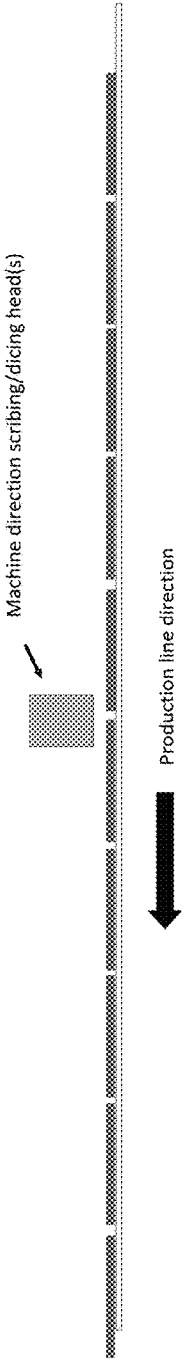
FIGS. 4A to 4C include a series of sideview illustrations of a set of semiconductor substrates positioned on a supporting sheet and being fully singulated in accordance with a multi-step singulation embodiment of the present invention where a combination partial physical scribing or dicing (cutting) in two dimensions and physical deformation is used to fully singulate the substrates in a predefined pattern.
Figure 4B:
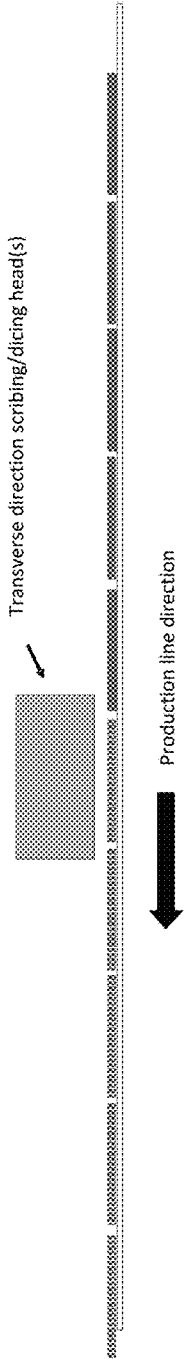
Figure 4C:
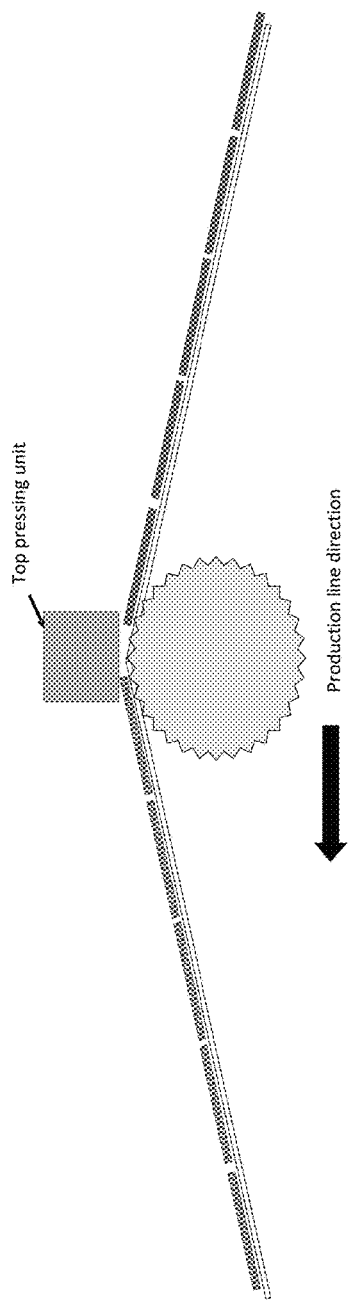
Figure 4F:
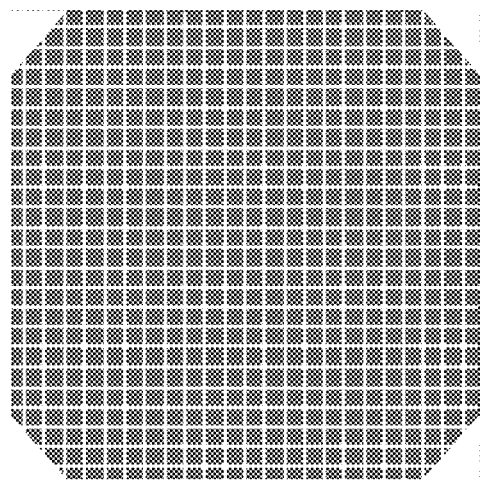
FIGS. 4D to 4F show a series of top views of a semiconductor substrate as it transitions through a separation/singulation/grooving process in accordance with embodiments of the present invention.
Figure 4E:
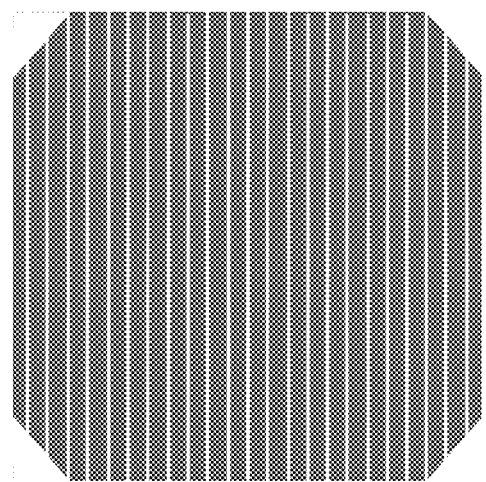
Figure 4D:
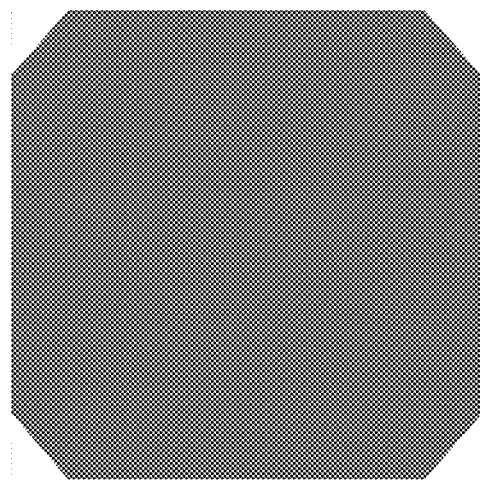
Figure 5A:
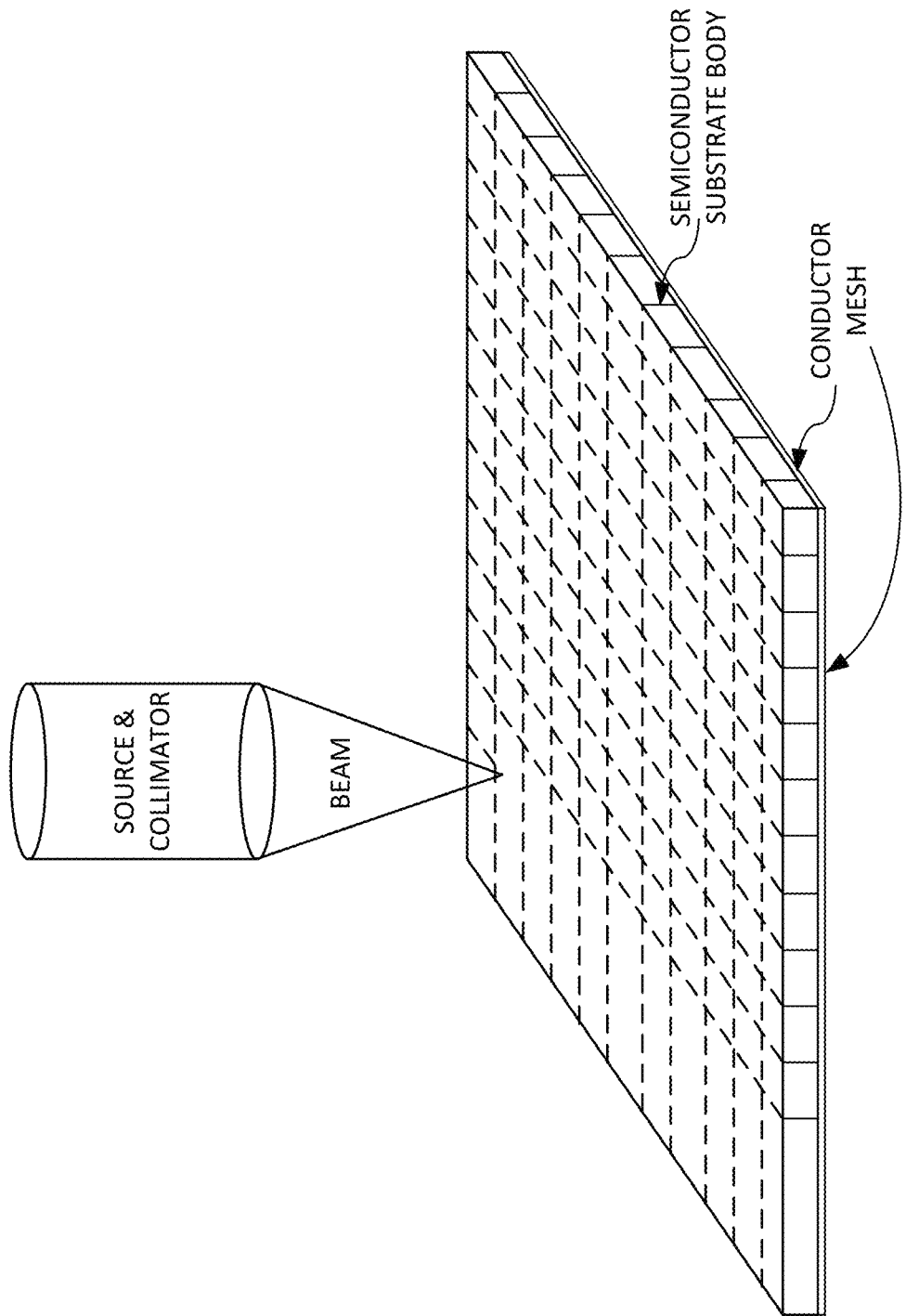
FIG. 5A is a functional level illustration of beam based semiconductor separation in accordance with embodiments of the present invention.

Turning now to FIGS. 3A to 3C, there are shown a series of top view illustrations of a set of semiconductor substrates positioned on a supporting sheet and being separated, grooved or singulated by a physical scribing or dicing (cutting) process performed by an automated cutter at a cutting station in accordance with embodiments of the present invention. FIGS. 4A to 4C include a series of sideview illustrations of a set of semiconductor substrates positioned on a supporting sheet and being fully singulated in accordance with a multi-step singulation embodiment of the present invention where a combination partial physical scribing or dicing (cutting) in two dimensions and physical deformation is used to fully singulate the substrates in a predefined pattern. FIGS. 4D to 4F show a series of top views of a semiconductor substrate as it transitions through a separation/singulation process in accordance with embodiments of the present invention;

Turning now to FIG. 5A, there is shown a functional level illustration of beam based semiconductor separation in accordance with embodiments of the present invention. The beam can be a laser, an electron beam, a sonic beam, a water stream, a gas/jet stream and or any other beam types known today or to be developed in the future. FIGS. 5B & 5C each show a series of top views of a semiconductor substrate as it transitions through exemplary separation/singulation processes in accordance with beam-based embodiments of the present invention.

Figure 5D:
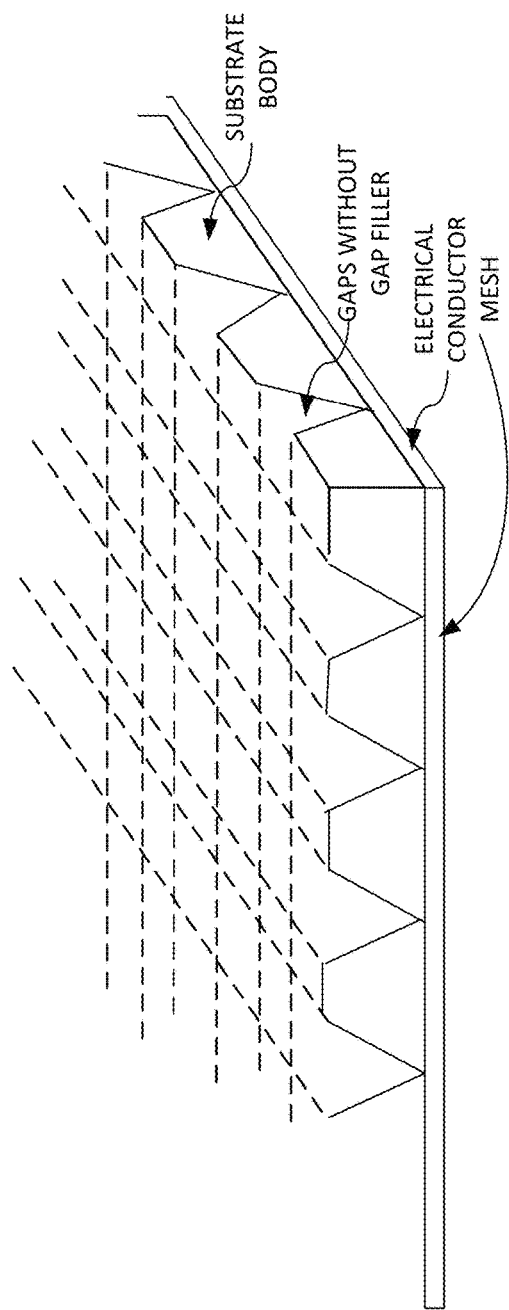
FIG. 5D is a prospective view of the semiconductor substrate body which has been separated, grooved or singulated in accordance with embodiments of the present invention and which includes an electrical conductor mesh, assembly or arrangement under the gaps formed by the singulation in accordance with further embodiments of the present invention.
Figure 5E:
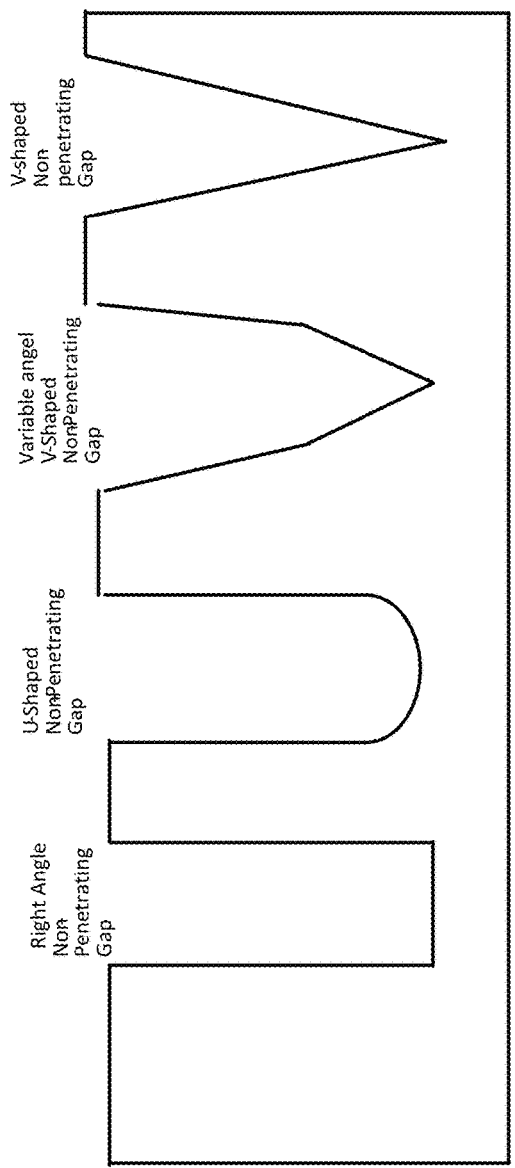
FIG. 5E is a side cross-section view of several optional semiconductor body gap formation geometries which could be produced and or used in accordance with embodiments of the present invention.

Turning now to FIG. 5D, there is shown a prospective view of a semiconductor substrate body which has been separated, grooved or singulated in accordance with embodiments of the present invention and which includes an electrical conductor mesh under the gaps formed by the singulation in accordance with further embodiments of the present invention. FIG. 5E is a side cross-section view of several optional semiconductor body gap formation geometries which could be produced and or used in accordance with embodiments of the present invention. Note should be made that this figure demonstrates a specific example or embodiment in which the wafer is pre-attached to a conductor mesh. This is not necessarily always the case.

Figure 6B:
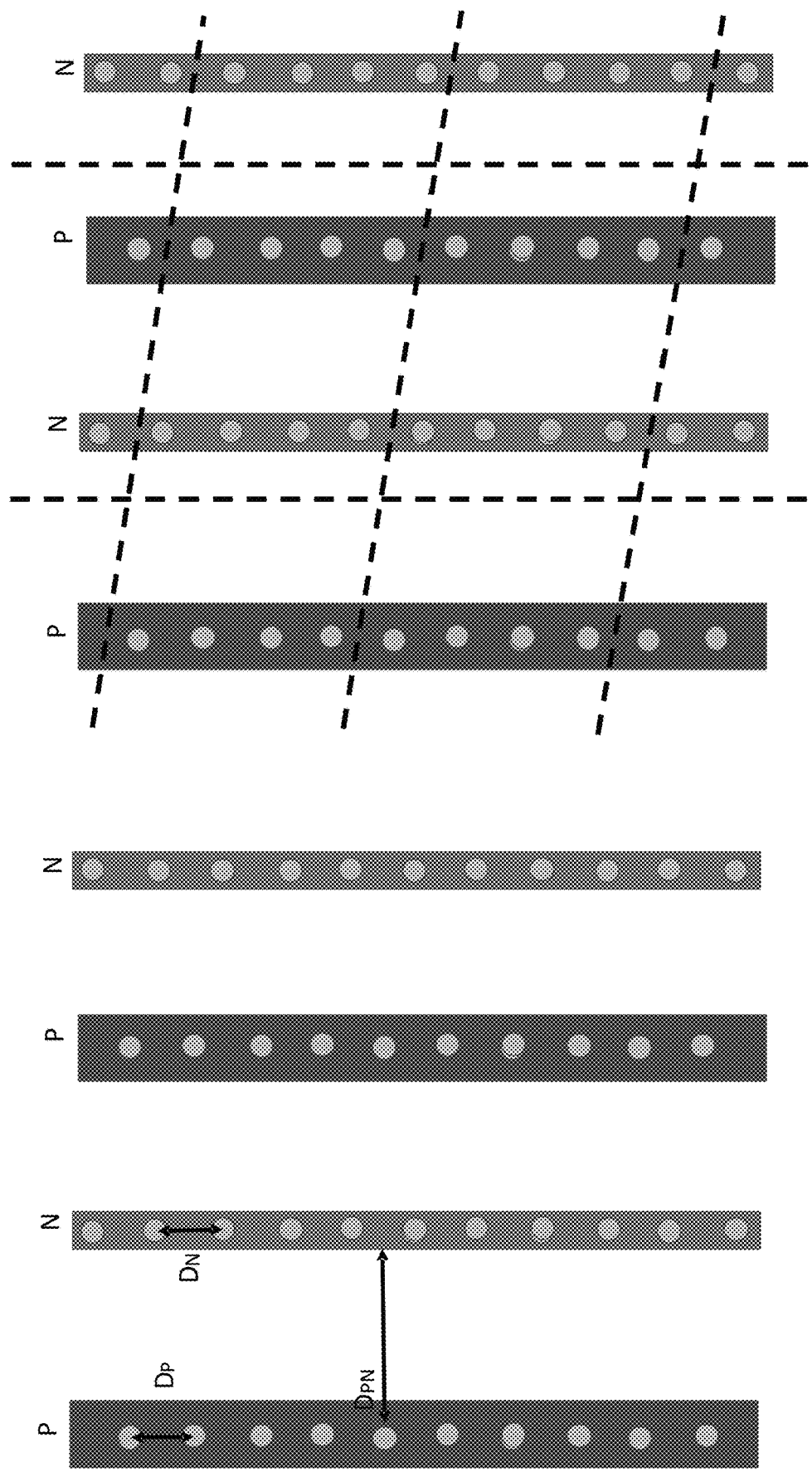

FIGS. 6A and 6B are bottom views of a semiconductor body according to PV device embodiment of the present invention where interdigitated positive and negative electrodes protrude out of the bottom of the substrate body, and wherein different separation/cutting patterns are used depending on a placement and arrangements of negative electrodes relative to corresponding positive electrodes. FIG. 6A show that when opposite corresponding electrodes align, rectangular cuts are used to singulate the PV cell. FIG. 6B show that when opposite corresponding electrodes do not align, diagonal cuts are used to singulate the PV cell.

Figure 7:
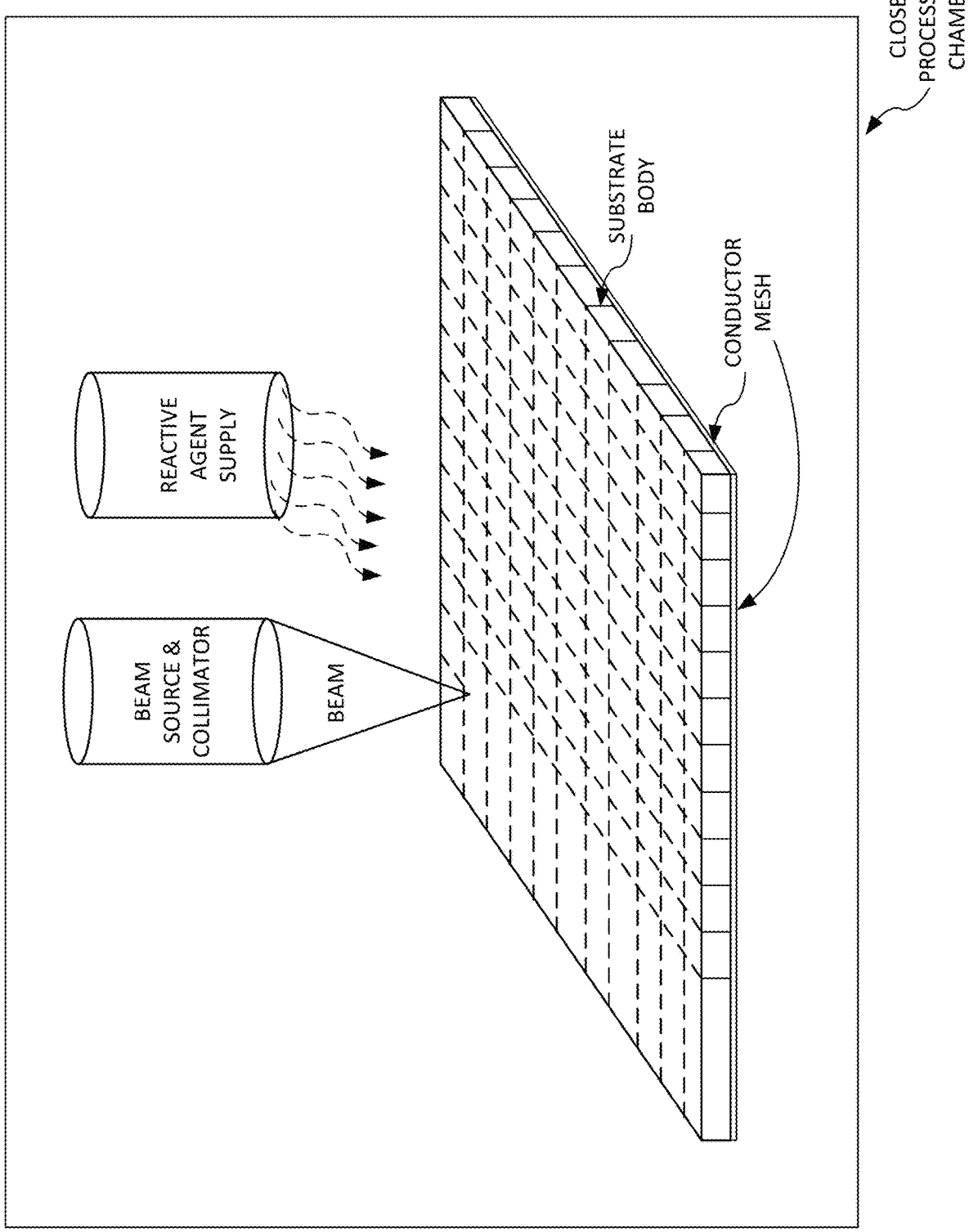
FIG. 7 is a functional level illustration of beam-based semiconductor separation in accordance with embodiments of the present invention where a reactive substance is provided during beam separation and which reactive substance may react with portions of the semiconductor body exposed to the separator beam because reactive substance may be excited by the beam.

Turning now to FIG. 7, there is shown a functional level illustration of beam-based semiconductor separation in accordance with embodiments of the present invention where a reactive substance is provided during beam separation and which reactive substance may react with portions of the semiconductor body exposed to the separator beam. This is only one possible option for gap filling in accordance with embodiments of the present invention. Every filler insertion or deposition known today or to be devised in the future may be applicable. FIG. 8A is a prospective view of a semiconductor substrate body singulated in accordance with some embodiments of the present invention and including a gap filler in the form of a coating on the gap sidewalls. FIG. 8B is a side cross-section view of several optional semiconductor body gap formation geometries which could be produced and or used in accordance with embodiments of the present invention also including a coating layer. The gap filling material may only coat the walls of the gap, may completely fill the gap, or fill the gap and over flow, thus creating a coating layer on the upper surface of the wafer.

FIGS. 9A through 9F includes three set of top and side illustrations of a semiconductor substrate/wafer body, wherein each set illustrates a transition of semiconductor substrate/wafer body from an untoughened configuration into each of three separate toughened configurations in accordance with embodiments of the present invention. They show three options: (1) partial top separation/singulation, filling and coating; (2) top and bottom partial separation/singulation, filling and coating; and (3) complete separation/singulation, filling and coating. In case (2) the top and bottom grooving maps may be the same or different and the filler material used in the gaps on either side may be the same or different.

Figure 10A:
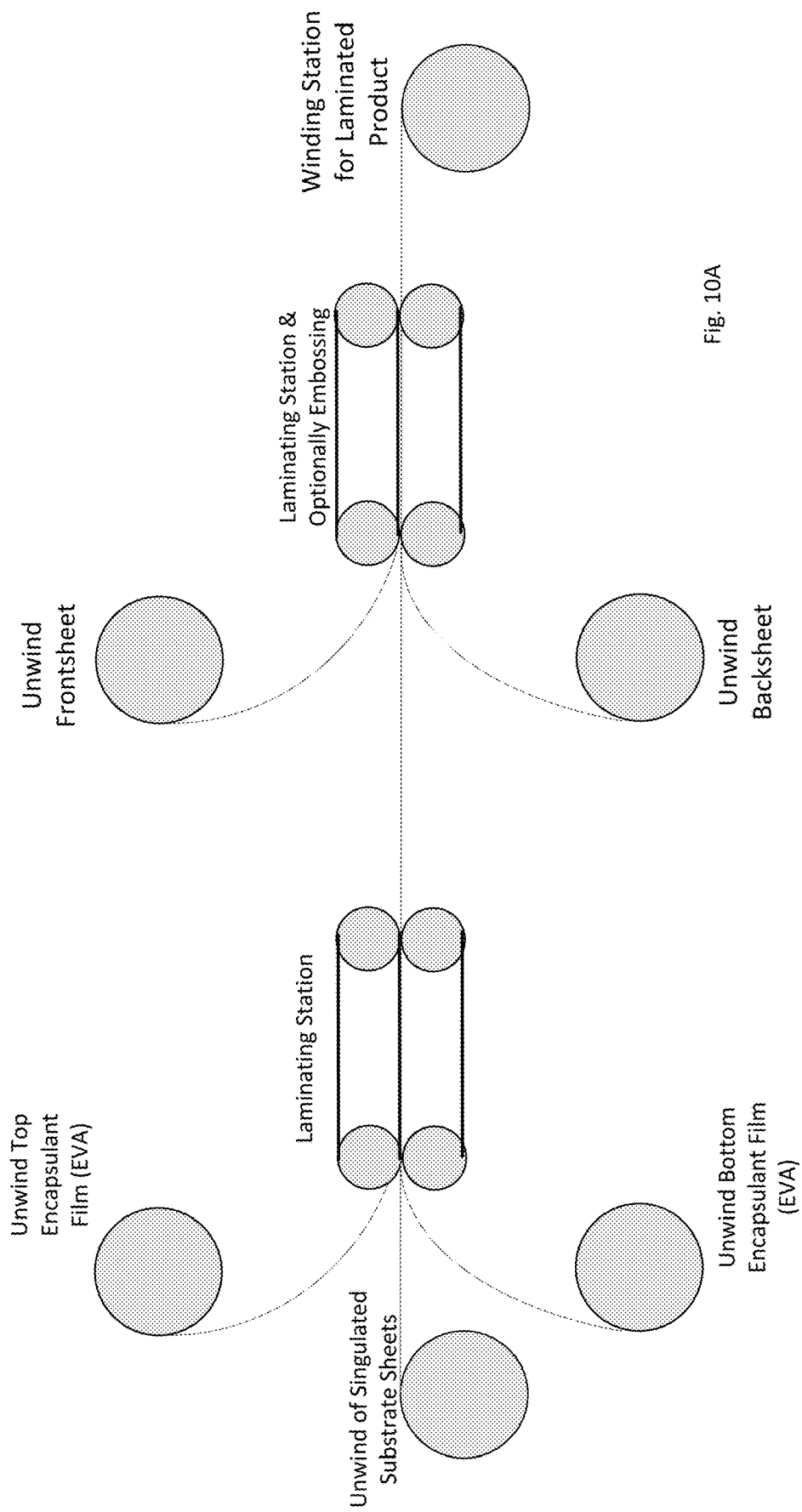
FIG. 10A is a functional block level illustration of a Photovoltaic (PV) related embodiment of the present invention wherein separated/singulated substrates, optionally on support sheets, are encapsulated within top and bottom EVA films and then within top and bottom polymer sheets, optionally with forming (e.g embossing, etching, machining) of optics on the top sheet.
Figure 10C:
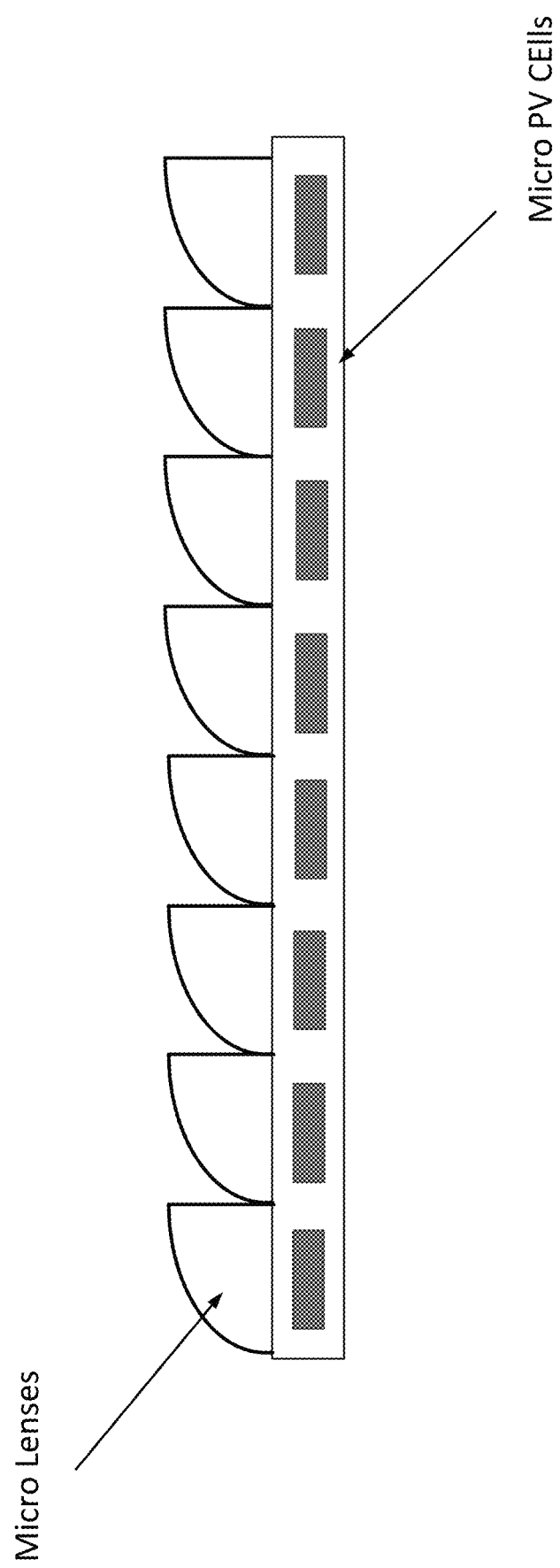
FIG. 10C is a sideview illustration of an array of micro PV cells toughened, encapsulated and covered with a micro-lens embossed top sheet in accordance with embodiments of the present invention. This illustration demonstrates an embodiment where asymmetric concentric micro-lenses may be used in correspondence to angle of solar radiation.

Turning now to FIG. 10A, there is shown a functional block level illustration of a Photovoltaic (PV) related embodiment of the present invention wherein separated/singulated/grooved substrates, optionally on support sheets, are encapsulated within top and bottom EVA films (as an example of an encapsulating material) and then within top and bottom polymer sheets. Materials other than polymer sheets may be used. The polymer sheets are optionally formed (embossed, etched, machined, ablated) with concentrating optics on the top sheet. FIG. 10B is a sideview illustration of a clear polymer embossing assembly to provide micro or mini lenses on a top sheet covering a toughened PV cell in accordance with embodiments of the present invention. FIG. 10C is a sideview illustration of an array of micro PV cells toughened, encapsulated and covered with a micro-lens embossed top sheet in accordance with embodiments of the present invention. Illustration 10C demonstrates an embodiment where asimetric concentratic microlenses may be used in correspondence to angle of solar radiation.

Functions, operations, components and/or features described herein with reference to one or more embodiments, may be combined or otherwise utilized with one or more other functions, operations, components and/or features described herein with reference to one or more other embodiments, or vice versa. While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention clsimed is:

1. A flexible and rollable Photovoltaic (PV) cell having enhanced properties of mechanical impact absorption, the PV cell comprising:
    a semiconductor body comprised at least partially of a semiconductor material with a formfactor including a top surface, a bottom surface, and at least one sidewall;
    a set of non-transcending gaps within said semiconductor body of said semiconductor material, wherein portions of semiconductor material on opposite sides of a respective non-transcending gap become movable relative to one another while a thin layer of said semiconductor body of said semiconductor material remains beneath said non-transcending gaps and is sufficiently thin to flex, and due to physical displacement dissipate mechanical stresses and absorb mechanical impacts applied to said semiconductor body; wherein said set of non-transcending gaps within said semiconductor body acts as crack propagation inhibitor;
    wherein said PV cell is flexible and rollable, and is freestanding and has enhanced properties of mechanical impact absorption due to having said set of gaps in the semiconductor material;
    wherein said flexible and rollable PV cell is comprised of a single semiconductor substrate which is segmented into segments by said set of non-transcending gaps which are placed only at one side of the semiconductor body;
    wherein at least some of said non-transcending gaps, that are only at one side of the semiconductor body, contain a gap filler material having force absorption properties and material toughening properties, which provides mechanical shock absorption, and which is formed of a material that provides chemical durability, thermal durability, and mechanical durability.

2. The PV cell according to claim 1,
    wherein the set of gaps within said semiconductor body extend in a pattern forming a PV cell having segments of said semiconductor body.

3. The PV cell according to claim 2,
    wherein each segment of the semiconductor body includes at least two electrode contacts connected to a different side of a PN junction within its respective segment of the semiconductor body.

4. The PV cell according to claim 3,
    wherein each of said electrode contacts is connected to a separate flexible conductor which interconnect corresponding electrode contacts on separate segments of the semiconductor body.

5. The PV cell according to claim 2,
    wherein each segment of the semiconductor body includes at least two electrode contacts on the same surface of said segment of the semiconductor body, and each electrode contact is electrically connected to a different side of a PN junction within its respective segment of the semiconductor body.

6. The PV cell according to claim 2,
    wherein a surface of said one side of each segment of the semiconductor body is a polygon selected from the group consisting of: (a) a square; (b) a rectangle; (c) a decagon; (d) a hexagon; (e) a heptagon; and (f) an octagon.

7. The PV cell according to claim 6,
    wherein each side of said polygon has a length in the range of 0.1 mm to 6 mm.

8. The PV cell according to claim 6,
    wherein the bottom surface of each segment of the semiconductor body has the same shape and different side lengths as said surface.

9. The PV cell according to claim 6, wherein a thickness of each segment of the semiconductor body, from the top surface to the bottom surface, is in a range between 0.01 mm and 6 mm.

10. The PV cell according to claim 2,
    wherein at least one sidewall of at least one segment of the semiconductor body is at a slope to said top surface or has a curved surface.

11. The PV cell according to claim 2,
    wherein sidewalls of at least one segment of the semiconductor body are coated with a material different from the material of said segment of the semiconductor body.

12. The PV cell according to claim 2,
    wherein sidewalls of at least one segment of the semiconductor body are coated with a passivation material.

13. The PV cell according to claim 2,
    wherein at least a part of the sidewall of at least one segment of the semiconductor body is coated with an electrically insulative material.

14. The PV cell according to claim 2,
    wherein the sidewall of at least one segment of the semiconductor body is coated with a compound produced when reacting the cell body material with a substance selected from the group consisting of: (a) oxygen, (b) ammonia, (c) nitrogen, (d) hydrogen, (e) argon, (f) a compound of two or more of said materials, (g) a mixture of two or more of said materials.

15. The PV cell according to claim 2,
    further including a clear polymer laminate located on a surface of said one side of each segment of the semiconductor body.

16. The PV cell according to claim 15,
    further including a clear top sheet and/or encapsulant having optical concentrators located above respective segments of the semiconductor body.

17. The PV cell according to claim 16,
    wherein said optical concentrators are formed in said clear top sheet by embossing, chemical etching, micro-machining, laser ablation or other means, during or after said clear polymer laminate is affixed to said PV cell.

18. The PV cell according to claim 16,
    whereas said optical concentrators are structured to direct sunlight from an optimized inclination angle to an active area of a respective segment of the semiconductor body by redirecting light headed towards one or more non-active parts of the same or nearby segment of the semiconductor body.

19. The PV cell according to claim 2,
wherein each segment of the semiconductor body comprises at least: a first electrode contact located under each segment of the semiconductor body, and a second electrode contact located above each segment of the semiconductor body, wherein each electrode contact is electrically connected to a different side of a PN junction within its respective segment of the semiconductor body.

* * * * *